United States Patent
Kim et al.

(10) Patent No.: US 12,344,754 B2
(45) Date of Patent: Jul. 1, 2025

(54) INK COMPOSITION, QUANTUM DOT COMPOSITE, AND COLOR CONVERSION PANEL AND DISPLAY DEVICE INCLUDING THE SAME

(71) Applicant: Samsung Display Co., LTD., Yongin-si (KR)

(72) Inventors: Soo Dong Kim, Hwaseong-si (KR); Bu Yong Kim, Goyang-si (KR); Da Hye Park, Asan-si (KR); Tae Young Song, Osan-si (KR); Ki Heon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 649 days.

(21) Appl. No.: 17/531,771

(22) Filed: Nov. 21, 2021

(65) Prior Publication Data

US 2022/0243084 A1 Aug. 4, 2022

(30) Foreign Application Priority Data

Feb. 3, 2021 (KR) ........................ 10-2021-0015666

(51) Int. Cl.
| | |
|---|---|
| *C09D 11/50* | (2014.01) |
| *B82Y 20/00* | (2011.01) |
| *C09D 11/033* | (2014.01) |
| *C09D 11/037* | (2014.01) |
| *C09D 11/107* | (2014.01) |
| *C09K 11/02* | (2006.01) |
| *C09K 11/08* | (2006.01) |
| *H10K 59/38* | (2023.01) |

(52) U.S. Cl.
CPC ............ *C09D 11/50* (2013.01); *C09D 11/033* (2013.01); *C09D 11/037* (2013.01); *C09D 11/107* (2013.01); *C09K 11/025* (2013.01); *C09K 11/08* (2013.01); *H10K 59/38* (2023.02); *B82Y 20/00* (2013.01)

(58) Field of Classification Search
CPC ........ C09D 5/22; C09D 11/033; C09D 11/03; C09D 11/037; C09D 11/107; C09K 11/08; C09K 11/025; H10K 59/38
See application file for complete search history.

(56) References Cited

U.S. PATENT DOCUMENTS

| | | |
|---|---|---|
| 10,439,155 B2 | 10/2019 | Park et al. |
| 10,585,228 B2 | 3/2020 | Kim et al. |
| 2017/0256591 A1 | 9/2017 | Li |
| 2020/0017704 A1 | 1/2020 | Yang et al. |
| 2020/0103709 A1 | 4/2020 | Madigan et al. |
| 2021/0382352 A1 | 12/2021 | Kim et al. |

FOREIGN PATENT DOCUMENTS

| | | |
|---|---|---|
| CN | 106468856 A | 3/2017 |
| CN | 107966878 A | 4/2018 |
| CN | 109749733 A | 5/2019 |
| CN | 110698919 A | 1/2020 |
| CN | 111512452 A | 8/2020 |
| JP | 2019112575 A | 7/2019 |
| JP | 2019116525 A | 7/2019 |
| JP | 2020015838 A | 1/2020 |
| JP | 2020076976 A | 5/2020 |
| KR | 10-2017-0078553 A | 7/2017 |
| KR | 10-2019-0029193 A | 3/2019 |
| KR | 20190109859 A | 9/2019 |
| KR | 10-2020-0105052 * | 9/2020 |
| KR | 10-2020-0105052 A | 9/2020 |
| KR | 102153629 B1 | 9/2020 |
| KR | 10-2021-0153170 | 12/2021 |

OTHER PUBLICATIONS

Translation for KR 10-2020-05052, Sep. 7, 2020.*
Extended European Search Report dated Jun. 24, 2022 , issued in European Patent Application No. 22154839.9.
Ernest Lee et al., "Quantum Dot Conversion Layers Through Inkjet Printing", ISSN 0097-996X/18/4701-0525, SID 2018 DIGET, (3 pages).
Li Chunfeng et al., "Review on the Progress and Application and Synthesis of Carbon Quantum Dots", China Academics Journal Electronic Publishing House, Nov. 29, 2015, (5 pages).
Zhang Hong-bo et al., "Synthesis of Metal Bromide Perovskite Quantum Dots and Their Controllable Emission", Anhui Chemical Industry, vol. 45, No. 1, Feb. 2019 (3 pages).

* cited by examiner

*Primary Examiner* — C Melissa Koslow
(74) *Attorney, Agent, or Firm* — KILE PARK REED & HOUTTEMAN PLLC

(57) ABSTRACT

An ink composition includes a plurality of quantum dots, a liquid monomer, an initiator, and optionally an organic solvent, wherein the plurality of quantum dots includes: a first quantum dot including a first ligand, and a second quantum dot including a second ligand different from the first ligand, and the ink composition is configured to emit a first light.

16 Claims, 9 Drawing Sheets

INK COMPOSITION, QUANTUM DOT COMPOSITE, AND COLOR CONVERSION PANEL AND DISPLAY DEVICE INCLUDING THE SAME

CROSS-REFERENCE TO RELATED APPLICATION

This application claims priority from and the benefit of Korean Patent Application No. 10-2021-0015666, filed on Feb. 3, 2021, which is hereby incorporated by reference for all purposes as if fully set forth herein.

BACKGROUND

Field

Embodiments of the invention relate generally to display devices, and more particularly, to an ink composition including quantum dots, a method for producing the same, a quantum dot composite produced therefrom, and a color conversion panel and a display device including the same.

Discussion of the Background

Quantum dots are nano-sized semiconductor nanocrystalline materials, for example, that can be changed by their size and/or composition to control their optical properties (e.g., luminous properties). The luminous properties of quantum dots may be applied to various electronic devices (e.g., display devices). For application to a device, a quantum dot or a composite including the same may have a form of a film or a pattern, which is being further researched.

The above information disclosed in this Background section is only for understanding of the background of the inventive concepts, and, therefore, it may contain information that does not constitute prior art.

SUMMARY

Applicant discovered a number of problems relating to production of ink compositions including quantum dot composites and solutions, as disclosed in detail herein.

For example, an ink composition including quantum dots, a method of preparing the ink composition, a quantum dot composite made from the ink composition, a color conversion panel or a display panel including the quantum dot composite, and an electronic device (e.g., a display device) including the color conversion panel constructed according to the principles and illustrative implementations of the invention can provide improved physical properties such as improved jetting properties and provide a large-area quantum dot (composite) single film or pattern when applied, for example, in an ink jet printing method.

Additional features of the inventive concepts will be set forth in the description which follows, and in part will be apparent from the description, or may be learned by practice of the inventive concepts.

According to one aspect of the invention, an ink composition includes a plurality of quantum dots, a liquid monomer, an initiator, and optionally an organic solvent, wherein the plurality of quantum dots includes: a first quantum dot including a first ligand, and a second quantum dot including a second ligand different from the first ligand, and the ink composition is configured to emit a first light.

The first light may be green light, red light, or blue light, and a maximum emission peak of the first light may have a full width at half maximum of less than or equal to about 45 nm.

The first ligand or the second ligand, independently from one another, may include a group of $RCOOH$, $RNH_2$, $R_2NH$, $R_3N$, $RSH$, $R_3PO$, $R_3P$, $ROH$, $RCOOR'$, $RPO(OH)_2$, $RHPOOH$, $R_2POOH$, a polymer organic ligand, or a combination thereof, wherein R and the R' are, defined herein.

The first ligand may include a monocarboxylic acid compound having a $C_{10}$ to $C_{40}$ substituted or unsubstituted hydrocarbyl group.

The second ligand may include an organic compound having a functional group of an amine group, a thiol group, a carboxylic acid group, a phosphine group, or a combination thereof and a moiety linked to the functional group and of the following formula:

wherein the variables are defined herein.

The liquid monomer may include a compound having a carbon-carbon double bond and a vapor pressure of less than or equal to about $10^{-5}$ mmHg.

The organic solvent may include a $C_3$ to $C_{40}$ substituted or unsubstituted aliphatic hydrocarbon solvent, a $C_6$ to $C_{40}$ substituted or unsubstituted aromatic hydrocarbon solvent, a $C_3$ to $C_{40}$ substituted or unsubstituted alicyclic hydrocarbon solvent, an alkylene glycol alkyl ether acetate solvent, an alkylacetamide solvent, or a combination thereof.

The liquid monomer may include a monoacrylate compound, a diacrylate compound, a triacrylate compound, a tetraacrylate compound, a pentaacrylate compound, or a hexaacrylate compound, or a combination thereof, or the organic solvent may include propylene glycolmonomethyletheracetate, dimethyl acetamide, cyclohexylacetate, or a combination thereof.

The ink composition may have a viscosity of less than or equal to about 40 cPs and a vapor pressure of less than or equal to about $10^{-3}$ mmHg.

The ink composition may have both an acid value and an amine value, and the acid value and the amine value may both be greater than or equal to about 35 mg KOH/g, or the difference between the acid value and amine value may be less than or equal to about 5 mg KOH/g.

The ink composition may form a film at a film residual rate after 30 minutes of initiating polymerization in an amount of greater than or equal to about 90% of the initial ink composition.

The ink composition may be configured with a relative EQE with respect to an initial value thereof of about 100% may be less than or equal to about 104% after irradiation for about 100 hours with light having a wavelength of about 450 nm at a temperature of about 60° C. to form a solid state after polymerization thereof.

According to another aspect of the invention, a method of preparing the ink composition may include preparing a first solution including the first quantum dot and the organic solvent, preparing a second solution including the second quantum dot and the liquid monomer; and mixing the first solution and the second solution to maintain a colloidal dispersion state.

The first solution and the second solution may satisfy one of the following conditions: at least one of the first solution and the second solution may not exhibit both an acid value and an amine value; if the first solution may exhibit either an acid value or an amine value, the second solution exhibits either of an acid value or an amine value; if the first solution may be amphoteric showing both of an acid value and an amine value, the second solution may also amphoteric; or if one of the first solution and the second solution may be amphoteric and the other may exhibit an acid value or an amine value, in a solution having an amphotericity, a difference between the acid value and the amine value may be less than about 5 mg KOH/g, or all of the acid value and amine value may be greater than or equal to about 35 mg KOH/g.

According to another aspect of the invention, an ink composition includes a liquid vehicle including an organic solvent and a liquid monomer; and a plurality of quantum dots and optionally metal oxide particles dispersed in the liquid vehicle, in the ink composition, an amount of the organic solvent is less than or equal to about 20 wt % based on a total weight of the ink composition, and the ink composition is configured so that a relative EQE for the initial EQE is less than or equal to about 104% during 100 hours of irradiation with excitation light having a wavelength of about 450 nm at a temperature of about 60° C. to form a solid state after polymerization.

The ink composition may be configured to emit a first light, and a maximum emission peak of the first light may have a full width at half maximum of less than or equal to about 45 nm.

The composition, a content of the organic solvent may be greater than or equal to about 1 wt % and less than or equal to about 10 wt %.

According to a further aspect of the invention, a quantum dot composite includes a matrix and a plurality of quantum dots dispersed in the matrix, wherein the plurality of quantum dots includes a first quantum dot including a first ligand and a second quantum dot including a second ligand different from the first ligand, the quantum dot composite emits light of a predetermined wavelength, the quantum dot composite is configured so that a relative EQE for the initial EQE is less than or equal to about 104% during 100 hours of irradiation with excitation light having a wavelength of about 450 nm at a temperature of about 60° C. to form a solid state after polymerization.

The matrix may exhibit both an acid value and an amine value, or the matrix may exhibit an acid value of less than about 50 mg KOH/g.

According to a yet further aspect of the invention, a color conversion apparatus may include a layer including a region to convert color and the region includes a first region to emit a first light, the first region including the quantum dot composite as defined above; and a partition wall defining each region of the layer.

The color conversion apparatus may include a color conversion panel, the region further may include a second region to emit a second light different from the first light and the second region may include the quantum dot composite.

According to a still yet further aspect of the invention, a display apparatus, includes a light emitter, the color converter apparatus as defined above, and a layer to transmit light disposed between the light emitter and the apparatus.

The light emitter may include a light emitting element or panel.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
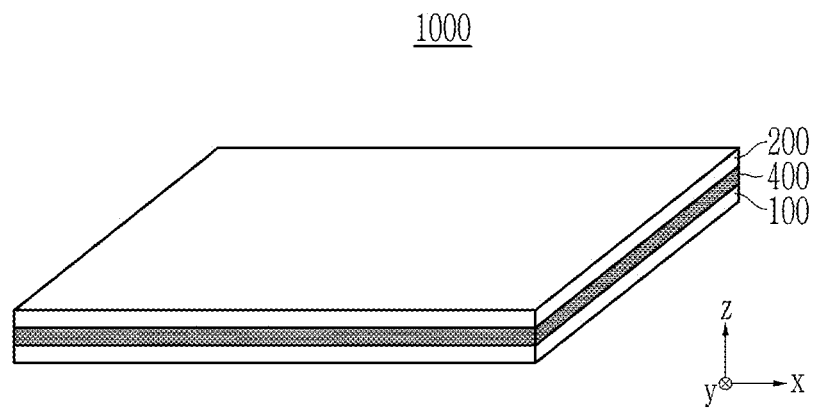
FIG. 1 is a perspective view of an embodiment of a display panel constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, substrates, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As used herein, the term "planar phase" means a case in which a target part is viewed from the top, and the term "cross-sectional phase" means a case in which a cross-section of the target part that is cut in a vertical direction is viewed from the side. When an embodiment may be implemented differently, a specific process order may be performed differently from the described order. For example, two consecutively described processes may be performed substantially at the same time or performed in an order opposite to the described order. Also, like reference numerals denote like elements, and redundant explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Definitions

Hereinafter, as used herein, when a definition is not otherwise provided, "substituted" refers to replacement of hydrogen of a compound, a group, or a moiety by a substituent selected from a $C_1$ to $C_{30}$ alkyl group, a $C_2$ to $C_{30}$ alkenyl group, a $C_2$ to $C_{30}$ alkynyl group, a $C_2$ to $C_{30}$ epoxy group, a $C_2$ to $C_{30}$ alkenyl group, a $C_2$ to $C_{30}$ alkylester group, a $C_3$ to $C_{30}$ alkenylester group (e.g., an acrylate group, a methacrylate group), a $C_6$ to $C_{30}$ aryl group, a $C_7$ to $C_{30}$ alkylaryl group, a $C_1$ to $C_{30}$ alkoxy group, a $C_1$ to $C_{30}$ heteroalkyl group, a $C_3$ to $C_{30}$ heteroalkylaryl group, a $C_3$ to $C_{30}$ cycloalkyl group, a $C_3$ to $C_{15}$ cycloalkenyl group, a $C_6$ to $C_{30}$ cycloalkynyl group, a $C_2$ to $C_{30}$ heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a $C_1$ to $C_6$ alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR", wherein R" is a $C_1$ to $C_6$ alkyl group or a $C_6$ to $C_{12}$ aryl group), a carboxyl group (—COOH) or a salt thereof (—C(=O)OM, wherein M is an organic or an inorganic cation), a sulfonic acid group (—SO$_3$H) or a salt thereof (—SO$_3$M, wherein M is an organic or an inorganic cation), a phosphoric acid group (—PO$_3$H$_2$) or a salt thereof (—PO$_3$MH or —PO$_3$M$_2$, wherein M is an organic or an inorganic cation), and a combination thereof.

In addition, when a definition is not otherwise provided below, "hetero" means at least one group including 1 to 3 heteroatoms selected from N, O, S, Si, or P.

As used herein, the term "alkylene group" is a linear or branched saturated aliphatic hydrocarbon group that optionally include at least one substituent and has two or more valences. As used herein, the term "arylene group" may be a functional group that optionally includes at least one substituent, and having two or more valences formed by removal of at least two hydrogens in at least one aromatic ring. As used herein, the term "alkyl group" refers to a monovalent linear or branched saturated aliphatic hydrocarbon group (e.g., which may optionally include one or more substituents). At least one methylene group in the alkyl group or alkylene group may be replaced by sulfonyl (—$SO_2$—), carbonyl (—CO—), ether (—O—), sulfide (—S—), sulfoxide (—SO—), ester (—C(=O)O—), amide (—C(=O)NR"—) (wherein R" is hydrogen or a $C_1$ to $C_{10}$ alkyl group), or a combination thereof.

In an embodiment, "aliphatic hydrocarbon group" may refer to a substituted or unsubstituted $C_1$ to $C_{100}$ straight or branched chain hydrocarbon group (e.g., a $C_1$ to $C_{30}$ alkyl, a $C_2$ to $C_{30}$ alkenyl, a $C_2$ to $C_{30}$ alkynyl). In an embodiment, the "aromatic hydrocarbon group" may refer to a $C_6$ to $C_{60}$ substituted or unsubstituted aryl group or a $C_2$ to $C_{60}$ heteroaryl group.

As used herein, the term "(meth)acrylate" refers to an acrylate and/or a methacrylate.

As used herein, "Group" refers to a Group of Periodic Table.

As used herein, "Group II" refers to Group IIA and Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and Tl, but are not limited thereto.

As used herein, "Group IV" refers to Group IVA and Group IVB, and examples of the Group IV metal may include Si, Ge, and Sn but are not limited thereto. As used herein, the term "metal" also includes a semi-metal such as Si.

As used herein, "Group I" refers to Group IA and Group IB, and may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, "cadmium free" or "non-cadmium" may refer to including an amount of cadmium in the corresponding structure in less than or equal to about 100 ppm by weight (ppmw). The Restriction of Hazardous Substances (RoHS) compliance definition requires that there must be no more than 0.01% (100 ppm) by weight of cadmium in the raw homogeneous precursor materials. As used herein, the level of cadmium in "cadmium free" or "non-cadmium" quantum dots is limited by a trace metal concentration in the precursor materials. The trace metal concentration (including cadmium) to the cadmium-free or non-cadmium quantum dot or the precursor thereof may be measured by the inductively coupled plasma mass spectroscopy (ICP-MS), which may be a level of ppb (parts per billion). In an embodiment, the amount of cadmium (or corresponding atom) in the "cadmium (or corresponding atom) free" quantum dot may be less than about 50 ppm, less than about 20 ppm, less than about 10 ppm, or less than about 1 ppm.

As used herein, a quantum dot is a nano-sized semiconductor nanocrystal and shows quantum confinement effects. The quantum dot may emit energy (e.g., light) according to bandgap energy by receiving light from an excitation source and reaching an energy excitation state. The quantum dot may control electrical, optical characteristics by adjusting a size and/or a composition thereof. The quantum dot may be applied for the various devices such as a light receiving element, a light emitting element, and the like. In order to apply for a device, quantum dots may be a form of composite film (or a pattern thereof) dispersed in a liquid vehicle (e.g., including an organic monomer or a polymer). The ink jetting is expected to provide a quantum dot composite film or a pattern having a wide area with a high efficiency. But as the properties (e.g., luminous properties) of quantum dots are significantly affected by the external environment, it may be a technical challenging task to provide a film or a pattern thereof capable of showing desired properties (e.g., luminous efficiency, reliability, etc.), e.g., through a solution process such as ink jet process.

Illustrative Embodiments

An ink composition according to an embodiment may provide a quantum dot composite single film (or a pattern thereof) capable of exhibiting improved physical properties (e.g., through a solution process).

In an embodiment, the ink composition includes a plurality of quantum dots, a liquid monomer, an initiator, and, optionally, (a limited amount of) an organic solvent. The plurality of quantum dots include a first quantum dot including a first ligand and a second quantum dot including a second ligand different from the first ligand.

In an embodiment, the ink composition may include a liquid vehicle including an organic solvent and a liquid monomer, a plurality of quantum dots and optionally metal oxide fine particles which are dispersed in the liquid vehicle, and the ink composition may include an organic solvent in an amount of less than or equal to about 20 weight percent (wt %), for example, less than or equal to about 15 wt % based on a total weight of the ink composition. The ink composition may exhibit improved stability (e.g., improved reliability when applied to a device).

The ink composition is configured to emit first light (or light of a predetermined wavelength, hereinafter referred to as first light) by photoexcitation. The first light may be green light, red light, or blue light (depending on the plurality of quantum dots). A maximum luminescent peak wavelength of the green light may range from about 500 nanometer (nm) to about 580 nm. A maximum luminescent peak wavelength of the red light may range from about 650 nm to about 670 nm. A maximum luminescent peak wavelength of the blue light may range from about 440 nm to about 490 nm. The first light has one maximum emission peak (e.g., is a single color light), and the full width at half maximum (FWHM) of the maximum emission peak may be less than or equal to about 45 nm, less than or equal to about 40 nm, less than or equal to about 35 nm, less than or equal to about 30 nm, or less than or equal to about 25 nm. The ink composition is configured so that a relative external quantum efficiency (EQE) for the initial EQE may be less than or equal to about 104% during 100 hours of irradiation with excitation light having a wavelength of 450 nm at a temperature of 60° C. in a solid state after polymerization.

The plurality of quantum dots (e.g., a first quantum dot and/or a second quantum dot, hereinafter, referred to as a quantum dot) may include a compound of Groups II-VI, a compound of Groups III-V, a compound of Groups IV-VI, an element or a compound of Group IV, a compound of Groups I, III and VI, a compound of Groups II, III, and VII, a compound of Groups I, II, IV, and VI, or a combination thereof. The plurality of quantum dots may not include cadmium. The plurality of quantum dots may not include lead, mercury, or a combination thereof.

The compound of Groups II-VI may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The compound of Groups II-VI may further include a Group III metal.

The compound of Groups III-V may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The compound of Groups III-V may further include a Group II metal (e.g., InZnP).

The compound of Groups IV-VI may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof.

Examples of the compound of Groups I, III, and VI may include $CuInSe_2$, $CuInS_2$, CuInGaSe, and CuInGaS, but are not limited thereto. Examples of the compound of Groups I, II, IV, and VI may include CuZnSnSe and CuZnSnS, but are not limited thereto.

The element or compound of Group IV may be selected from a single substance selected from Si, Ge, and a mixture thereof; and a binary element compound selected from SiC, SiGe, and a mixture thereof.

The binary element compound, the ternary element compound or the quaternary element compound respectively exist in a uniform concentration in the particle or partially different concentrations in the same particle. The quantum dot may have a core/shell structure wherein a first semiconductor nanocrystal surrounds another second semiconductor nanocrystal. The core and the shell may have an interface, and an element of at least one of the core or the shell in the interface may have a concentration gradient wherein the concentration of the element(s) of the shell decreases toward the core. The semiconductor nanocrystal may have a structure including one semiconductor nanocrystal core and a multi-layered shell surrounding the same. Herein, the multi-layered shell has at least two shells wherein each shell may be a single composition, an alloy, and/or the one having a concentration gradient In the quantum dot, the shell material and the core material may have different bandgap energies. For example, the bandgap energy of the shell material may be greater than that of the core material. In another embodiment, the bandgap energy of the shell material may be less than that of the core material. The quantum dot may have a multi-layered shell. In the multi-layered shell, the energy bandgap of the outer layer may be greater than the energy bandgap of the inner layer, i.e., the layer nearer to the core. In the multi-layered shell, the energy bandgap of the outer layer may be less than the energy bandgap of the inner layer. The quantum dot may control an absorption/emission wavelength by adjusting a composition and a size. The quantum dot may emit green light, red light, or blue light. A maximum luminescent peak wavelength of the quantum dot may be an ultraviolet (UV) to infrared wavelength or a wavelength of greater than the above wavelength range.

In an embodiment, the maximum luminescent peak wavelength of the quantum dot may be greater than or equal to about 300 nm, for example, about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the quantum dot may be less than or equal to about 800 nm, less than or equal to about for example, about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum luminescent peak wavelength of the quantum dot may be in the range of about 500 nm to about 650 nm.

The maximum luminescent peak wavelength of the quantum dot emitting green light (or the center wavelength of the green light when the first light is green light) may be in the range of about 500 nm to about 580 nm, about 510 nm to about 560 nm, or about 520 nm to about 540 nm. The maximum luminescent peak wavelength of the quantum dot emitting the red light (or the wavelength of the red light when the first light is red light) may be in the range of about 600 nm to about 670 nm, about 610 nm to about 650 nm, or about 620 nm to about 640 nm. The maximum luminescent peak wavelength of the quantum dot emitting blue light (or the center wavelength of the blue light when the first light is blue light) may be greater than or equal to about 440 nm, greater than or equal to about 450 nm and less than or equal to about 480 nm, or less than or equal to about 470 nm.

The quantum dot may have quantum efficiency of greater than or equal to about 10%, greater than or equal to about for example, about 30%, greater than or equal to about 50%, greater than or equal to about 60%, greater than or equal to about 70%, greater than or equal to about 90%, or even about 100%. The quantum dot may have for example a full width at half maximum (FWHM) of an emission wavelength spectrum of less than or equal to about 50 nm, less than or equal to about for example about 45 nm, less than or equal to about 40 nm, or less than or equal to about 30 nm.

The quantum dot(s) may have a (average) size of greater than or equal to about 1 nm and less than or equal to about 100 nm. The (average) size of the quantum dot(s) may be about 1 nm to about 20 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or for example less than or equal to about 10 nm. The shape of the quantum dot is not particularly limited. For example, the shape of the quantum dot may be generally spherical, generally polyhedral, generally pyramidal, generally multipodal, generally cubical, generally rectangularly parallelepiped, generally nanotube-shaped, generally nanorod-shaped, generally nanowire-shaped, generally nanosheet-shaped, or a combination thereof, but is not limited thereto. The quantum dots may be commercially available or may be appropriately synthesized. The plurality of quantum dots may not include perovskite-based quantum dots.

In an embodiment, the quantum dots may be synthesized by a wet synthesis method, and may include an organic ligand (hereinafter, also referred to as a native ligand), e.g., bound to the surface. The organic ligand coordinates the surface of the prepared nanocrystal (quantum dot), and may enable the quantum dots to be dispersed in a medium, e.g., a solution or a monomer. The organic ligand may affect the physical properties (e.g., light emission and electrical properties) of the quantum dot.

In the ink composition of an embodiment, the organic ligand of the plurality of quantum dots may have a functional group for binding to the quantum dots and a moiety for dispersion in a medium (e.g. a liquid vehicle, an organic solvent, or a liquid monomer). In the plurality of quantum dots, the first ligand included in the first quantum dots may help dispersion of the quantum dots in a predetermined organic solvent. The first ligand may be a native ligand. However, Applicant has discovered that the first ligand is not easy to provide a desired degree or level of dispersibility for a desired liquid monomer. The liquid monomer may be desired for the formation of a solid-state quantum dot film (e.g., through polymerization, etc.) in the ink composition. Therefore, when the liquid vehicle includes a significant amount of the liquid monomer, the first quantum dot may have difficulty in exhibiting dispersibility level required for film formation.

The first ligand may be bound to the first quantum dot or its surface. The first ligand may be configured to disperse the first quantum dots in the organic solvent. The second ligand may be bound to the second quantum dot or its surface. The second ligand may be configured to disperse the second quantum dots in the liquid monomer.

In the ink composition of an embodiment, the plurality of quantum dots further includes the second quantum dot to which the second ligand is bound. The second ligand may be configured to disperse the second quantum dots in the liquid monomer. The second quantum dots having the second ligand may be dispersed in a liquid monomer to form, for example, a liquid monomer-quantum dot composition exhibiting colloidal dispersibility.

However, Applicant has discovered that when the quantum dot film obtained by polymerizing the liquid monomer-quantum dot composition is placed to a short wavelength (e.g., about 440 nm to about 480 nm, about 450 nm to about 460 nm) light and an increased temperature (e.g., greater than or equal to about 50° C., or greater than or equal to about 60° C.) for a prolonged time (e.g., greater than or equal to about 10 hours, greater than or equal to about 50 hours, or greater than or equal to about 150), it may show significantly changed (e.g., significantly higher) luminous efficiency than the initial luminous efficiency of quantum dots (hereinafter, referred to as overshoot for the phenomenon). Without being bound by any particular theory, the efficiency change is considered because the original efficiency of quantum dots may be recovered by rearrangement of an organic ligand in a matrix. The efficiency change may have unfavorable influences on the driving reliability for the corresponding device e.g., final device.

Significantly and unexpectedly, the ink composition obtained by mixing the aforementioned liquid monomer quantum dot composition with an organic solution including a first quantum dot having a first ligand may solve the aforementioned overshoot problem while showing a desired dispersibility. In addition, Applicant has discovered that the adding an organic solution including a first quantum dot may be able to have an increased amount of an inorganic material while causing the final quantum dot ink composition to indicate the desired, e.g., reduced level, viscosity.

In an embodiment, the viscosity may be measured by any known method. The viscosity may be measured using a commercially available (e.g., viscometers sold under the trade designation HAAKE series manufactured by Thermo Fisher Scientific of Waltham, MA, etc.) rheometer (or viscometer). For example, the viscosity may be measured using a rotary rheometer, an extension rheometer, a falling-ball viscometer, rotational viscometer, and the like.

The first ligand or the second ligand may include a group of RCOOH, $RNH_2$, $R_2NH$, $R_3N$, RSH, $R_3PO$, $R_3P$, ROH, RCOOR', $RPO(OH)_2$, $RHPOOH$, $R_2POOH$, a polymer organic ligand, or a combination thereof. Herein, R and R' may independently include a substituted or unsubstituted $C_1$ to $C_{100}$ (e.g., $C_3$ to $C_{50}$ or $C_5$ to $C_{24}$) aliphatic hydrocarbon group, a substituted or unsubstituted $C_6$ to $C_{50}$ (e.g., $C_6$ to $C_{24}$) aromatic hydrocarbon group, or a combination thereof. At least one methylene of the aliphatic hydrocarbon group may be optionally replaced by sulfonyl (—$SO_2$—), carbonyl (—CO—), ether (—O—), sulfide (—S—), sulfoxide (—SO—), ester (—C(=O)O—), amide (—C(=O)NR''—), wherein R'' is hydrogen or a $C_1$ to $C_{10}$ alkyl group), or a combination thereof. The polymeric organic ligand may have a polyurethane moiety.

The first ligand (or second ligand) may include, a $C_1$ to $C_{100}$ substituted or unsubstituted alkylamine (an ethyl amine, a propyl amine, a butyl amine, a pentyl amine, a hexyl amine, an octyl amine, a dodecyl amine, a hexadecyl amine, an octadecyl amine, a dimethyl amine, a diethyl amine, a dipropyl amine, or a trioctylamine); a $C_2$ to $C_{40}$ substituted or unsubstituted carboxylic acid compound (e.g., a methanoic acid, an ethanoic acid, a propanoic acid, a butanoic acid, a pentanoic acid, a hexanoic acid, a heptanoic acid, an octanoic acid, a dodecanoic acid, a hexadecanoic acid, an octadecanoic acid, an oleic acid, or a benzoic acid); a mono-, di-, or tri alkyl or an aryl phosphine or an oxide compound thereof (or a phosphine oxide compound) such as a methyl phosphine, an ethyl phosphine, a propyl phosphine, a butyl phosphine, a pentyl phosphine, a diphenyl phosphine, a triphenyl phosphine compound or, and the like; an oxide compound thereof; a $C_5$ to $C_{20}$ phosphonic acid; a $C_5$ to $C_{20}$ phosphinic acid, and the like. The first organic ligand or the second ligand may be used alone or as a mixture of two or more.

The first organic ligand and the second ligand may not exhibit an acid value or an amine value. The first organic ligand and the second organic ligand may each independently exhibit an acid value or an amine value (described below) depending on the selection. When the first organic ligand exhibits both an acid value and an amine value (e.g., amphoteric), the second organic ligand may also exhibit amphotericity. The acid value, amine value, and amphotericity will be described in more detail below with reference to a dispersant and an ink preparation method, and the descriptions may be applied to the first organic ligand and the second organic ligand.

In an embodiment, the organic compound of the second ligand may be a multi-functional organic compound having two or more of functional groups as described herein. In an embodiment, the first ligand may be a monocarboxylic acid compound having a $C_{10}$ to $C_{40}$ hydrocarbyl group (e.g., an alkyl group, an alkenyl group, or an alkynyl group), or a monoamine compound having a $C_{10}$ to $C_{40}$ hydrocarbyl group (e.g., an alkyl group, an alkenyl group, or an alkynyl group), or a combination thereof. The first ligand may include an oleic acid, an oleylamine, or a combination thereof.

In an embodiment, the second ligand may include a $C_1$ to $C_{100}$ (e.g., a $C_5$ to $C_{60}$, or a $C_7$ to $C_{20}$) (multi-functional) organic compound having a functional group selected from an amine group, a thiol group, a carboxylic acid group, a phosphine group, or a combination thereof.

The organic compound may include a moiety linked to the functional group and of the following chemical formula:

 L-A wherein, in the above chemical formula, L is a substituted or unsubstituted $C_1$ to $C_{30}$ alkylene group, a substituted or unsubstituted $C_2$ to $C_{30}$ alkenylene group, a substituted or unsubstituted $C_3$ to $C_{30}$ cycloalkylene group, a substituted or unsubstituted $C_3$ to $C_{30}$ heterocycloalkylene group, a substituted or unsubstituted $C_6$ to $C_{30}$ arylene group, or a substituted or unsubstituted $C_3$ to $C_{30}$ heteroarylene group, sulfonyl (—$SO_2$—), carbonyl (—CO—), ether (—O—), sulfide (—S—), sulfoxide (—SO—), ester (—C(=O)O—), amide (—C(=O)NR"—), wherein R" is hydrogen or a $C_1$ to $C_{10}$ alkyl group), or a combination thereof, A is hydrogen, —COOH, —NR"$_3$ (wherein R" is hydrogen or a $C_1$ to $C_{10}$ alkyl group), or a combination thereof, and

* is a moiety linked to the functional group (e.g., an amine group, a thiol group, a carboxylic acid group, a phosphine group, or a combination thereof).

If desired, the second organic ligand may be bound to the second quantum dot (e.g., through an organic ligand exchange process). The organic ligand exchange process may be performed by reacting an organic ligand and a quantum dot for exchange in an organic solvent, for example, in an elevated state. The organic solvent for the ligand exchange reaction is not particularly limited, and an appropriate solvent used for the quantum dot colloid synthesis may be selected. Examples of the organic solvent may be selected from $C_6$ to $C_{22}$ primary alkylamines such as a hexadecylamine; a $C_6$ to $C_{22}$ secondary alkylamines such as a dioctylamine; a $C_6$ to $C_{40}$ tertiary alkylamines such as a trioctylamine; nitrogen-containing heterocyclic compounds such as a pyridine; $C_6$ to $C_{40}$ aliphatic hydrocarbons (e.g., alkanes, alkenes, alkynes, etc.) such as a hexadecane, an octadecane, an octadecene and a squalene; $C_6$ to $C_{30}$ aromatic hydrocarbons such as a phenyldodecane, a phenyltetradecane, and a phenyl hexadecane; a phosphine substituted with a $C_6$ to $C_{22}$ alkyl group such as a trioctylphosphine; phosphine oxide substituted with a $C_6$ to $C_{22}$ alkyl group such as a trioctylphosphine oxide; $C_{12}$ to $C_{22}$ aromatic ethers such as a phenyl ether and a benzyl ether, and combinations thereof. The temperature for the ligand exchange reaction may be appropriately selected, and may be greater than or equal to about 40° C., greater than or equal to about 50° C., greater than or equal to about 60° C., and less than or equal to about 150° C., less than or equal to about 140° C., or less than or equal to about 100° C., but is not limited thereto.

In the ink composition, an amount of the plurality of quantum dots may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, greater than or equal to about 40 wt %, greater than or equal to about 45 wt %, or greater than or equal to about 48 wt % based on a total solid content of the composition. In the ink composition, an amount of the plurality of quantum dots may be greater than or equal to about 1 wt %, greater than or equal to about 20 wt %, greater than or equal to about 30 wt %, greater than or equal to about 40 wt %, or greater than or equal to about 45 wt % and less than or equal to about 70 wt %, less than or equal to about 60 wt %, or less than or equal to about 55 wt % based on a total solid content of the composition.

In the ink composition, the content of the plurality of quantum dots may be less than or equal to about 60 wt %, less than or equal to about 55 wt %, less than or equal to about 50 wt %, less than or equal to about 45 wt %, less than or equal to about 40 wt %, or less than or equal to about 35 wt % based on a total solid content of the composition. The ink composition of an embodiment may exhibit an increased inorganic material content by improving dispersion characteristics.

In the ink composition, a content ratio between the second quantum dots and the first quantum dots may be appropriately selected. In an embodiment, a weight ratio between the first quantum dot: the second quantum dot may be about 1:99 to about 99:1, about 5:95 to about 95:5, about 10:90 to about 90:10, about 15:85 to about 85:15, about 20:80 to about 80:20, about 25:75 to about 75:25, about 30:70 to about 70:30, about 35:65 to about 65:35, about 40:60 to about 60:40, about 45:55 to about 55:45, or a combination thereof. In the ink composition, a weight ratio between the first quantum dot and the second quantum dot (the first quantum dot weight:the second quantum dot weight) may be about 1:99 to about 99:1.

In the ink composition of an embodiment, the liquid monomer may include a compound having a carbon-carbon double bond and a vapor pressure of less than or equal to about $10^{-4}$ mmHg, for example, less than or equal to about $10^{-5}$ mmHg. As used herein, the vapor pressure, the viscosity, or the surface tension may be a value measured at room temperature, for example, about 20° C. to about 25° C., e.g., about 20° C., about 23° C., or about 25° C.

The liquid monomer may include a $C_3$ to $C_{100}$ monoacrylate compound, a $C_6$ to $C_{150}$ diacrylate compound, a $C_9$ to $C_{200}$ triacrylate compound, a $C_{12}$ to $C_{250}$ tetraacrylate compound, a pentaacrylate compound, or a $C_{18}$ to $C_{300}$ hexaacrylate compound, or a combination thereof. The liquid monomer may form a (e.g., electrically insulating) polymer by polymerization, and a quantum dot composite to be described below may include, for example, the polymer as a matrix.

The liquid monomer may include an acrylate compound. The acrylate compound may include an alkyl(meth)acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, pentaerythritolhexa(meth) acrylate, bisphenol A di(meth)acrylate, bisphenol A epoxyacrylate, trimethylolpropanetri(meth)acrylate, ethylene glycolmonomethylether(meth)acrylate, novolacepoxy (meth)acrylate, diethylene glycoldi(meth)acrylate, triethylene glycoldi(meth)acrylate, propylene glycoldi(meth)acrylate, tris(meth)acryloyloxyethyl phosphate, or a combination thereof. In an embodiment, the monomer may include a di(meth)acrylate compound, a tri(meth)acrylate compound, a tetra(meth)acrylate compound, a penta(meth)acrylate compound, a hexa(meth)acrylate compound, or a combination thereof, but is not limited thereto.

In an embodiment, the liquid monomer may include hexamethylene di(meth)acrylate, tetraethylene glycol di(meth)acrylate, dipropylene glycoldi(meth)acrylate, tripropylene glycoldi(meth)acrylate, triethylene glycoldi (meth)acrylate, or a combination thereof.

In the ink composition, an amount of the liquid monomer may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a total solid content of the composition. In the ink composition, the content of the liquid monomer may be less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, or less than or equal to about 15 wt % based on a total solid content of the composition. In the ink composition, an amount of the liquid monomer may be greater than or equal to about 1 wt %, greater than or equal to about 5 wt %, or greater than or equal to about 10 wt % and less than or equal to about 50 wt %, less than or equal to about 45 wt %, less than or equal to about 40 wt %, less than or equal to about 35 wt %, less than or equal to about 30 wt %, or less than or equal to about 25 wt % based on a total solid content of the composition.

The ink composition may further include an organic solvent. The organic solvent may be a solvent capable of dispersing the first quantum dots. The organic solvent may include a $C_3$ to $C_{40}$ substituted or unsubstituted aliphatic hydrocarbon solvent, a $C_6$ to $C_{40}$ substituted or unsubstituted aromatic hydrocarbon solvent, a $C_3$ to $C_{40}$ substituted or unsubstituted alicyclic hydrocarbon solvent, an alkylene glycol alkyl ether acetate solvent, an alkylacetamide solvent, or a combination thereof. The organic solvent may have a vapor pressure of less than or equal to about 5 mmHg, less than or equal to about 4 mmHg, less than or equal to about 3.5 mmHg, less than or equal to about 3 mmHg, less than or equal to about 2.5 mmHg, or less than or equal to about 1 mmHg. The organic solvent may include dipropylene glycol monomethylether acetate (DPMA), polyglycidylmethacrylate (PGMA), diethylene glycol monoethyletheracetate (EDGAC), propylene glycol methyletheracetate (PGMEA), dialkylacetamide (e.g., dimethyl acetamide (DMA)), cyclohexylacetate (CHA), or a combination thereof. The organic solvent may include or may not include a chloroform, a halogenated aromatic compound such as chlorobenzene, cyclohexane, hexane, heptane, octane, hexadecane, undecane, decane, dodecane, xylene, toluene, benzene, octadecane, tetradecane, butyl ether, ethanol, or a combination thereof.

In the ink composition, an amount of the organic solvent may be greater than or equal to about 0.01 wt %, greater than or equal to about 0.05 wt %, greater than or equal to about 0.1 wt %, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 12 wt %, or greater than or equal to about 15 wt % based on a total weight of the ink composition. In the ink composition, an amount of the organic solvent may be greater than or equal to about 0.01 wt %, greater than or equal to about 1 wt %, greater than or equal to about 5 wt %, greater than or equal to about 10 wt %, greater than or equal to about 15 wt %, or greater than or equal to about 20 wt % and less than or equal to about 50 wt %, less than or equal to about 40 wt %, less than or equal to about 30 wt %, less than or equal to about 25 wt %, less than or equal to about 15 wt %, less than or equal to about 10 wt %, or less than or equal to about 5 wt % based on a total weight of the ink composition.

In the ink composition, the content of the organic solvent may be less than or equal to about 50 wt %, less than or equal to about 40 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, less than or equal to about 3 wt %, less than or equal to about 2 wt %, or less than or equal to about 1 wt % based on a total weight of the ink composition.

In the ink composition of an embodiment, the initiator may be a compound capable of initiating polymerization (e.g., radical polymerization) of the aforementioned monomer or the like by energy (e.g., heat or light). The initiator may include a thermal initiator and/or a photoinitiator. Types of the thermal initiator may include azobisisobutyronitrile, and the like, but are not limited thereto. The photoinitiator may include a triazine-based compound, an acetophenone compound, a benzophenone compound, a thioxanthone compound, a benzoin compound, an oximeester compound, an aminoketone compound, a phosphine or phosphineoxide compound, a carbazole-based compound, a diketone compound, a sulfonium borate-based compound, a diazo-based compound, a biimidazole-based compound, or a combination thereof, but is not limited thereto. The type of each of the aforementioned initiators is known and is not particularly limited. In the ink composition, an amount of the initiator may be greater than or equal to about 0.01 wt % and less than or equal to about 10 wt % based on a total solid content of the composition. In the ink composition, an amount of the initiator may be greater than or equal to about 0.1 wt %, greater than or equal to about 0.5 wt %, greater than or equal to about 1 wt %, greater than or equal to about 1.5 wt %, greater than or equal to about 2 wt %, greater than or equal to about 2.5 wt %, or greater than or equal to about 3 wt % based on a total solid content of the composition. In the ink composition, the amount of the initiator may be less than or equal to about 10 wt %, less than or equal to about 5 wt %, less than or equal to about 4 wt %, less than or equal to about 3 wt %, less than or equal to about 2 wt %, less than or equal to about 1 wt %, or less than or equal to about 0.5 wt % based on a total solid content of the composition.

The ink composition may further include a dispersant. The dispersant may disperse quantum dots and/or metal oxide fine particles to be described below. The dispersant may include a polymer. The dispersant may include a substituted or unsubstituted urethane polymer (e.g., a polyurethane), a substituted or unsubstituted alkylene polymer (e.g., a polyethylene (PE), a polypropylene (PP), etc.), a substituted or unsubstituted poly(meth)acrylate, a substituted or unsubstituted epoxy polymer, a substituted or unsubstituted polyester, or a combination thereof. The dispersant or the polymer may include, for example, a carboxylic acid group, an amine group, or a combination thereof in its main chain. The dispersant may include a carbon-carbon double bond and may participate in polymerization as described below. The dispersant may be a compound containing a repeating unit of Chemical Formula A-1, Chemical Formula A-2, or Chemical Formula A-3 (e.g., a polymer such as a polyurethane):

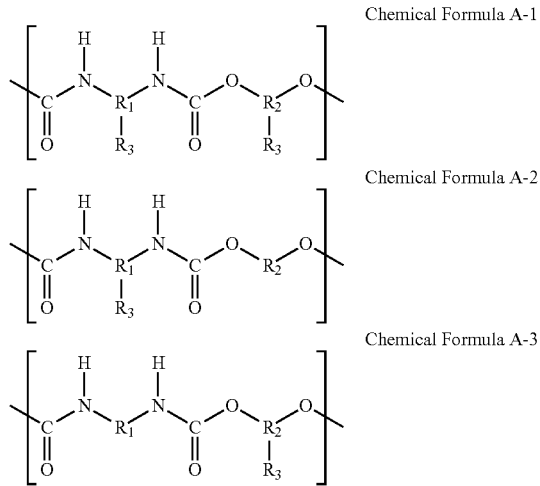

Chemical Formula A-1

Chemical Formula A-2

Chemical Formula A-3

In the above chemical formulas, $R_1$ and $R_2$ are each independently substituted or unsubstituted alkylene, and $R^3$ is an organic group including an amine group, a carboxylic acid group, or a combination thereof.

The dispersant may exhibit an acid value and/or an amine value. As disclosed herein, the acid value refers to the number of milligram (mg) of potassium hydroxide (KOH) required to neutralize the free fatty acid contained in 1 gram (g) of a given compound. The method of obtaining the acid value is known. As disclosed herein, the amine value refers to the amine content contained in a given compound. The amine value may be a value exhibiting a titrated amount of KOH consumption per 1 g of amine in milligram (mg). The amine value may be determined by a known method. The ink composition of an embodiment may exhibit a desired acid value and/or amine value by including the dispersant and/or the aforementioned first and second organic ligands. In an embodiment, an acid value of a polymer may be obtained (for example, calculated) from the "titrated volume" of a potassium hydroxide (KOH) solution. In an embodiment, the acid value may be measured by a titration method wherein a known amount (e.g., 100 gram) of sample dissolved in an organic solvent and titrated with an alcohol (e.g. ethanol) solution of KOH of known concentration using a commercially available titrator or using a color indicator (e.g., phenolphthalein)

In an embodiment, the dispersant (or the first or second organic ligand, or the ink composition) may have an acid value of less than or equal to about 5 mg KOH/g. In an embodiment, the dispersant may have an acid value of greater than or equal to about 10 mg KOH/g or greater than or equal to about 20 mg KOH/g. In an embodiment, the dispersant (or the first or second organic ligand, or the ink composition) may have an acid value of greater than or equal to about 35 mg KOH/g, greater than or equal to about 40 mg KOH/g, greater than or equal to about 45 mg KOH/g, greater than or equal to about 50 mg KOH/g, greater than or equal to about 55 mg KOH/g, greater than or equal to about 60 mg KOH/g, greater than or equal to about 65 mg KOH/g, greater than or equal to about 70 mg KOH/g, greater than or equal to about 75 mg KOH/g, greater than or equal to about 80 mg KOH/g, greater than or equal to about 85 mg KOH/g, greater than or equal to about 90 mg KOH/g, greater than or equal to about 95 mg KOH/g, or greater than or equal to about 100 mg KOH/g. In an embodiment, the dispersant may have an acid value of less than or equal to about 300 mg KOH/g, less than or equal to about 250 mg KOH/g, less than or equal to about 200 mg KOH/g, less than or equal to about 180 mg KOH/g, less than or equal to about 150 mg KOH/g, or less than or equal to about 130 mg KOH/g, less than or equal to about 110 mg KOH/g, less than or equal to about 100 mg KOH/g, less than or equal to about 90 mg KOH/g, less than or equal to about 80 mg KOH/g, less than or equal to about 70 mg KOH/g, less than or equal to about 60 mg KOH/g, less than or equal to about 50 mg KOH/g, or less than or equal to about 45 mg KOH/g.

In an embodiment the dispersant (or the first or second organic ligand, or the ink composition) may have an amine value of less than or equal to about 5 mg KOH/g. In an embodiment, the dispersant (or the first or second organic ligand or the ink composition) may have an amine value of greater than or equal to about 10 mg KOH/g, greater than or equal to about 20 mg KOH/g, or greater than or equal to about 35 mg KOH/g.

When the dispersant has both an acid value and an amine value (that is, if it is amphoteric), a difference between the acid value and the amine value in the dispersant may be less than about 5. When the dispersant is amphoteric, the dispersant may have an acid value and an amine value of greater than or equal to about 35 mg KOH/g.

In an embodiment, the dispersant (or the first or second organic ligand, or the ink composition) may have an amine value of greater than or equal to about 35 mg KOH/g, greater than or equal to about 40 mg KOH/g, greater than or equal to about 45 mg KOH/g, greater than or equal to about 50 mg KOH/g, greater than or equal to about 55 mg KOH/g, greater than or equal to about 60 mg KOH/g, greater than or equal to about 65 mg KOH/g, greater than or equal to about 70 mg KOH/g, greater than or equal to about 75 mg KOH/g, greater than or equal to about 80 mg KOH/g, greater than or equal to about 85 mg KOH/g, greater than or equal to about 90 mg KOH/g, greater than or equal to about 95 mg KOH/g, or greater than or equal to about 100 mg KOH/g. In an embodiment, the dispersant may have an amine value of less than or equal to about 300 mg KOH/g, less than or equal to about 250 mg KOH/g, less than or equal to about 200 mg KOH/g, less than or equal to about 180 mg KOH/g, less than or equal to about 150 mg KOH/g, or less than or equal to about 130 mg KOH/g, less than or equal to about 110 mg KOH/g, less than or equal to about 100 mg KOH/g, less than or equal to about 90 mg KOH/g, less than or equal to about 80 mg KOH/g, less than or equal to about 70 mg KOH/g, less than or equal to about 60 mg KOH/g, or less than or equal to about 50 mg KOH/g.

The ink composition may have both an acid value and an amine value, and a difference between the acid value and the amine value may be less than about 5 mg KOH/g. The ink composition has both an acid value and an amine value, and both the acid value and the amine value may be greater than or equal to about 35 mg KOH/g. The ink composition may exhibit an acid value and an amine value at the same time. The ink composition has both acid value and amine value of greater than or equal to about 35 mg KOH/g, for example greater than or equal to about 40 mg KOH/g. Alternatively, an acid value and an amine value or a difference thereof may be less than or equal to about 5 mg KOH/g (e.g., less than or equal to about 3 mg KOH/g).

The ink composition may have an acid value in a range of about 5 mg KOH/g to about 200 mg KOH/g, about 10 mg KOH/g to about 180 mg KOH/g, about 15 mg KOH/g to about 170 mg KOH/g, about 20 mg KOH/g to about 160 mg KOH/g, about 25 mg KOH/g to about 150 mg KOH/g, about 30 mg KOH/g to about 140 mg KOH/g, about 35 mg KOH/g to about 130 mg KOH/g, about 40 mg KOH/g to about 120 mg KOH/g, about 45 mg KOH/g to about 110 mg KOH/g, about 50 mg KOH/g to about 100 mg KOH/g, about 55 mg KOH/g to about 90 mg KOH/g, about 60 mg KOH/g to about 80 mg KOH/g, about 65 mg KOH/g to about 70 mg KOH/g, or a combination thereof.

The ink composition may have an amine value in a range of about 5 mg KOH/g to about 200 mg KOH/g, about 10 mg KOH/g to about 180 mg KOH/g, about 15 mg KOH/g to about 170 mg KOH/g, about 20 mg KOH/g to about 160 mg KOH/g, about 25 mg KOH/g to about 150 mg KOH/g, about 30 mg KOH/g to about 140 mg KOH/g, about 35 mg KOH/g to about 130 mg KOH/g, about 40 mg KOH/g to about 120 mg KOH/g, about 45 mg KOH/g to about 110 mg KOH/g, about 50 mg KOH/g to about 100 mg KOH/g, about 55-90 mg KOH/g, about 60 mg KOH/g to about 80 mg KOH/g, about 65 mg KOH/g to about 70 mg KOH/g, or a combination thereof.

The dispersant capable of generating the aforementioned acid value/amine value may include any dispersant used in the ink composition. These dispersants are commercially available (e.g., 's sold under the trade designation DisperByk series by BYK-Chemie part of Altana, AG group of Wesel, Germany, and sold under the trade designation EFKA series by Ajinomoto-Fine-Techno Co., Inc., of Kanagawa, Japan, etc.) and may be appropriately selected in consideration of the used liquid vehicle, quantum dots, metal oxide fine particles, and the like.

In the ink composition, the content of the dispersant may be selected in consideration of the acid value/amine value of the final ink composition, the types of the first and second organic ligand, quantum dots, and the like. In the ink composition, the content of the dispersant may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on the total solid. In the ink composition, the content of the dispersant may be less than or equal to about 70 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, or less than or equal to about 5 wt % based on a total solid content of the composition.

The ink composition may further include a plurality of metal oxide fine particles. The metal oxide fine particles may contribute to the improvement of optical properties (e.g., luminance improvement) of the quantum dot composite, which will be described below. The metal oxide fine particles may include a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, a yttrium oxide, a lanthanum oxide, a ruthenium oxide, a cerium oxide, a tantalum oxide, a niobium oxide, or a combination thereof. The average size of the metal oxide fine particles may be greater than or equal to about 150 nm, greater than or equal to about 180 nm, or greater than or equal to about 200 nm. The average size of the metal oxide fine particles may be less than or equal to about 500 nm, less than or equal to about 400 nm, less than or equal to about 350 nm, or less than or equal to about 300 nm. An average size of the metal oxide fine particles may be greater than or equal to about 150 nm and/or less than or equal to about 500 nm.

In the ink composition, the content of the metal oxide fine particles may be greater than or equal to about 1 wt %, greater than or equal to about 5 wt %, greater than or equal to about 10 wt %, greater than or equal to about 15 wt %, or greater than or equal to about 18 wt % based on the total solid content. In the ink composition, the content of the metal oxide fine particles may be less than or equal to about 25 wt %, less than or equal to about 20 wt %, less than or equal to about 15 wt %, less than or equal to about 10 wt %, or less than or equal to about 5 wt % based on the total solid content. In the ink composition, when present, an amount of the metal oxide fine particles may be greater than or equal to about 1 wt %, greater than or equal to about 5 wt %, or greater than or equal to about 10 wt % and less than or equal to about 20 wt %, or less than or equal to about 15 wt % based on a total solid content of the composition. In another embodiment, the method of preparing the ink composition, includes preparing a first solution including the first quantum dot and the organic solvent, preparing a second solution including the second quantum dots and the liquid monomer; and mixing the first solution and the second solution substantially without precipitation (e.g., while maintaining a colloidal dispersion state).

The method may further include removing at least a portion of the organic solvent from the ink composition. The first solution and the second solution may satisfy one of the following conditions: at least one of the first solution and the second solution may not exhibit both an acid value and an amine value; when the first solution exhibits either an acid value or an amine value, the second solution exhibits one of an acid value and an amine value; when the first solution is amphoteric showing both an acid value and an amine value, the second solution is also amphoteric; or when one of the first solution and the second solution is amphoteric and the other exhibits an acid value or an amine value, in a solution having an amphotericity, a difference between the acid value and the amine value may be less than about 5 mg KOH/g, or all of the acid value and amine value are greater than or equal to about 35 mg KOH/g.

The initiator, the dispersant, and the metal oxide fine particles may be included in the first solution, the second solution, or both. Particularly, the first solution may further include the initiator, the dispersant, the metal oxide fine particles, or a combination thereof, and the second solution may further include the initiator, the dispersant, the metal oxide fine particles, or a combination thereof. At least one of the first solution or the second solution may include the initiator.

Unlike the organic pigment or the like, the dispersion state of quantum dots (and, if present, metal oxide fine particles) in the ink composition may have substantial influences on luminous properties and inject processability of the ink composition and quantum dot composite obtained therefrom. The ink composition of an embodiment may achieve a desired dispersion state (e.g., colloidal dispersion state). Applicant has discovered that acid values and amine values of the first solution and the second solution may have substantial influences on the dispersion state of the final ink composition.

In an embodiment, in order to maintain the dispersed state of the ink composition, the first solution and the second solution used in the method may be any of the following cases: at least one of the first solution and the second solution may not exhibit both an acid value and an amine value; if the first solution exhibits either of an acid value and an amine value, the second solution also exhibits either of an acid value and an amine value; if the first solution exhibits both of an acid value and an amine value, the second solution also exhibits both an acid value and an amine value; or if one of the first and second solutions exhibits both an acid value and an amine value (i.e., is amphoteric), and the other has only an acid value or an amine value, in the solution having an amphotericity, a difference between the acid value and the amine value may be less than about 5 mg KOH/g, or both acid and amine values may be greater than or equal to about 35 mg KOH/g.

The acid value and amine value of the first solution and the second solution may be controlled so as to be a desired value (e.g., so as to correspond to one of the aforementioned conditions) by the dispersant and/or the first and second organic ligands included therein. The content of the first quantum dots (or second quantum dots) in the first solution (or the second solution) and, if present, the contents of an initiator, a dispersant, or metal oxide fine particles may be appropriately selected considering each component included in the solution and the final ink composition.

In the ink composition of an embodiment, by having the aforementioned characteristics, the quantum dot (composite) film or the pattern thereof may be provided according to, for example, ink jet method, and the obtained film (or pattern) may show improved properties (e.g., luminous efficiency or driving reliability when applied to a device). In the ink composition of an embodiment, quantum dots and, if present, metal oxide fine particles may show improved dispersion state. The ink composition may maintain a colloidal dispersion state. In the ink composition of an embodiment (or in a quantum dot composite to be described below), a dispersed phase may be a solid, and a continuous liquid vehicle (continuous medium) may be a liquid (or a solid). Herein, the term "colloidal dispersion" means a dispersion in which the dispersed phase has a dimension of greater than or equal to about 1 nm, (e.g., greater than or equal to about 10 nm, greater than or equal to about 50 nm, or greater than or equal to about 100 nm) and several micrometers (μm) or less (e.g., less than or equal to about 5 μm, less than or equal to about 4 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm).

The ink composition of an embodiment may be prepared by mixing the first solution and the second solution, so that the final composition may exhibit physical properties (e.g., viscosity) that are more suitable for an ink jet process. In an embodiment, a viscosity of the ink composition may be greater than or equal to about 1 centipoise (cPs), greater than or equal to about 3 cPs, greater than or equal to about 5 cPs, greater than or equal to about 7 cPs, greater than or equal to about 9 cPs, greater than or equal to about 11 cPs, greater than or equal to about 13 cPs, or greater than or equal to about 15 cPs. The viscosity may be less than or equal to about 43 cPs, less than or equal to about 40 cPs, less than or equal to about 35 cPs, less than or equal to about 30 cPs, less than or equal to about 25 cPs, less than or equal to about 20 cPs, less than or equal to about 18 cPs, less than or equal to about 15 cPs, less than or equal to about 12 cPs, less than or equal to about 10 cPs, or less than or equal to about 7 cPs. The ink composition may have a viscosity of less than or equal to about 40 cPs, less than or equal to about 30 cPs, less than or equal to about 25 cPs, less than or equal to about 20 cPs, less than or equal to about 15 cPs, or less than or equal to about 10 cPs at room temperature or an ambient temperature (e.g., about 20° C. or about 25° C.).

A surface tension of the ink composition may be greater than or equal to about 15 meter-Newton per meter (mN/m), greater than or equal to about 20 mN/m, greater than or equal to about 25 mN/m, or greater than or equal to about 30 mN/m. The surface tension may be less than or equal to about 100 mN/m, less than or equal to about 90 mN/m, less than or equal to about 80 mN/m, less than or equal to about 70 mN/m, less than or equal to about 60 mN/m, less than or equal to about 50 mN/m, less than or equal to about 40 mN/m, or less than or equal to about 35 mN/m. The ink composition may have a surface tension of greater than or equal to about 15 mN/m at 23° C.

A vapor pressure of the ink composition may be less than or equal to about 2.5 millimeter of mercury (mmHg), less than or equal to about 2 mmHg, less than or equal to about 1.5 mmHg, or less than or equal to about 1 mmHg. The ink composition may have a vapor pressure of less than or equal to about 5 mmHg, for example, less than or equal to about 1 mmHg, less than or equal to about $10^{-1}$ mmHg, less than or equal to about $10^{-2}$ mmHg, less than or equal to about $10^{-3}$ mmHg, or less than or equal to about $10^{-4}$ mmHg, or less than or equal to about $10^{-5}$ mmHg.

A film residual ratio of the ink composition may be greater than or equal to about 90 percent (%), for example, greater than or equal to about 91%, greater than or equal to about 92%, greater than or equal to about 93%, greater than or equal to about 94%, or greater than or equal to about 95%. The film residual ratio may be, for example, a film residual ratio when 30 minutes (min) elapse after polymerization (or curing) in an ink jet process. As an example, the ink composition may have a film residual ratio of greater than or equal to about 90% when 30 minutes elapse in the form of a film. The film residual ratio may be a film residual ratio in a lapse of passing a predetermined time (e.g., after passing 30 minutes) after ejecting ink at a room temperature under the air atmosphere.

The film residual ratio is measured by the following equation:

Film residual ratio=[(Volume of ink film)/(Volume of ink filled in pixel unit)]×100

The volume of the ink film may be measured by a three-dimensional surface profiler. The ink volume may be obtained by the volume of ink to be ejected. The ink composition may exhibit improved quantum efficiency. In an embodiment, the quantum dots in the ink composition (or composite to be described below) may exhibit a quantum efficiency of greater than or equal to about 30%, greater than or equal to about 40%, greater than or equal to about 50%, greater than or equal to about 60%, or greater than or equal to about 65%. The quantum efficiency may be measured using a commercially available spectrophotometer, for example, by absolute or relative methods.

The film residual ratio may be measured at room temperature (RT). The film residual ratio may be measured in an air atmosphere. The ink composition may relatively mitigate the overshoot phenomenon of luminous properties, e.g., of luminous efficiency, compared to the composition including only ligand-exchanged quantum dots e.g., by including the aforementioned different ligands. Thus the ink composition according to an embodiment may be configured so that the relative luminous efficiency to the initial luminous efficiency of the quantum dot composite shows less than or equal to about 104%, for example, less than or equal to about for example, about 103%, or less than or equal to about 102%, during irradiating excitation light in a wavelength of about 450 nm at a temperature of about 60° C. for about 100 hours (at a solid state, for example, at a state of quantum dots (composite) film or pattern formed by polymerization).

The ink composition of an embodiment may exhibit improved jetting properties and provide a large-area quantum dot (composite) single film or pattern when applied, for example, in an ink jet printing method. According to the preparing method of an embodiment, a composition having a desired level of physical properties, e.g., viscosity, etc., may be prepared while inhibiting or preventing phase separation or precipitation. The formed quantum dot single film or pattern may exhibit driving stability without sudden change in luminous efficiency when applied to a device.

The ink composition may have a form of film (or a pattern thereof) by any coating process (e.g., spin coating, slit coating, or ink jet coating). It may provide a quantum dot composite film (or pattern) according to an ink jet printing (or coating) method. When using an ink jet method, the ink composition according to an embodiment is ejected on a substrate (or on a pixel area). The ink composition according to an embodiment may form a film or a pattern (e.g., without increasing a temperature, for example, at about 20 to about 30° C. or a room temperature) using the ink jet equipment (with reference to a manual provided by the equipment manufacturer).

The obtained film (or pattern) may provide a solid quantum dot composite or pattern through optionally, drying and polymerizing (or curing). The equipment for the ink jet process is known and commercially available. The polymerizing or curing condition (temperature, time, atmosphere, etc.) may be appropriately selected considering a type of liquid monomer and an initiator included in the ink, but is not limited thereto. In an embodiment, the polymerization or cure may be accompanied with a thermal polymerization or a photo polymerization.

The quantum dot composite of an embodiment includes a matrix and the plurality of quantum dots dispersed in the matrix, and the plurality of quantum dots include a first quantum dot including a first ligand and a second quantum dot including a second ligand different from the first ligand, and the quantum dot composite emits light of a predetermined wavelength (e.g., by photoexcitation), and is configured so that a relative external quantum efficiency (EQE) with respect to the initial EQE (100%) may be less than or equal to about 104% as the composite is irradiated for about 100 hours with excitation light having a wavelength of 450 nm at a temperature of 60° C. in a solid state after polymerization.

The light of the predetermined wavelength may be green light or red light. The matrix may include a crosslinked polymer (including, for example, a polymerization product of the aforementioned liquid monomer). The matrix may not include a linear polymer having a carboxylic acid group, a cardo binder, or a combination thereof.

The matrix may or may not include a linear polymer having a carboxylic acid group in the repeating unit (e.g., a polymer having a relatively high acid value at an acid value of about 50 mg KOH/g to about 200 mg KOH/g), a cardo binder resin, or a combination thereof. The quantum dot composite may be prepared from the aforementioned ink composition. Accordingly, the matrix may further include the aforementioned dispersant. The quantum dot composite may further include the aforementioned metal oxide fine particles.

The quantum dot composite may be in the form of a (patterned) film. The thickness of the film may be greater than or equal to about 1 micrometer (μm), greater than or equal to about 5 μm, greater than or equal to about 6 μm, greater than or equal to about 7 μm, greater than or equal to about 8 μm, or greater than or equal to about 9 μm. It may be less than or equal to about 20 μm, less than or equal to about 6 μm, less than or equal to about 10 μm, or less than or equal to about 8 μm.

The quantum dot composite may have an increased amount of an inorganic material. In an embodiment, the quantum dot composite may have an amount of the inorganic material that is greater than or equal to about 50 wt %, greater than or equal to about 55 wt %, greater than or equal to about 57 wt %, greater than or equal to about 58 wt %, greater than or equal to about 59 wt %, greater than or equal to about 60 wt %, greater than or equal to about 61 wt %, greater than or equal to about 62 wt %, greater than or equal to about 63 wt %, greater than or equal to about 64 wt %, greater than or equal to about 65 wt %, greater than or equal to about 66 wt %, greater than or equal to about 67 wt %, greater than or equal to about 68 wt %, greater than or equal to about 69 wt %, or greater than or equal to about 70 wt % based on a total weight of the composite.

Details of the first and second quantum dots, liquid monomer, dispersant, and metal oxide fine particles are the same as described above. The quantum dot composite (film or pattern) obtained from the ink composition of an embodiment may be used in a color conversion apparatus, which may be in the form of color conversion panel and a display panel including the same. In an embodiment, the color conversion panel includes a region configured to convert color in the form of a color conversion region (e.g., disposed on a substrate) including a color conversion region and optionally a partition wall defining each region of the color conversion layer. The color conversion region includes a quantum dot (polymer) composite and a first region emitting first light. Moreover, the color conversion region includes a first region configured to emit a first light (e.g., by irradiation of excitation light), and the first region includes the quantum dot composite. The color conversion region may further include a second region emitting second light different from the first light and including a quantum dot composite. Moreover, the color conversion region may further include a second region configured to emit a second light different from the first light (e.g., by excitation light irradiation), and the second region may include a quantum dot composite.

The first light and the second light have different maximum luminescent peak wavelengths in a light emission spectrum. In an embodiment, the first light may be red light having a maximum luminescent peak wavelength present within about 600 nm to about 670 nm (e.g., about 620 nm to about 650 nm), and the second light may be green light having a maximum luminescent peak wavelength present within about 500 nm to about 580 nm (e.g., about 500 nm to about 550 nm).

In another embodiment, the display panel includes a light emiter, which may be in the form of a light emitting panel, a color conversion panel, a light transmitting layer disposed between the light emitting panel and the color conversion panel. The display panel may further include a binding agent binding the light emitting panel and the color conversion panel. Hereinafter, a display panel and a color conversion panel will be described with reference to the drawings.

Figure 2:
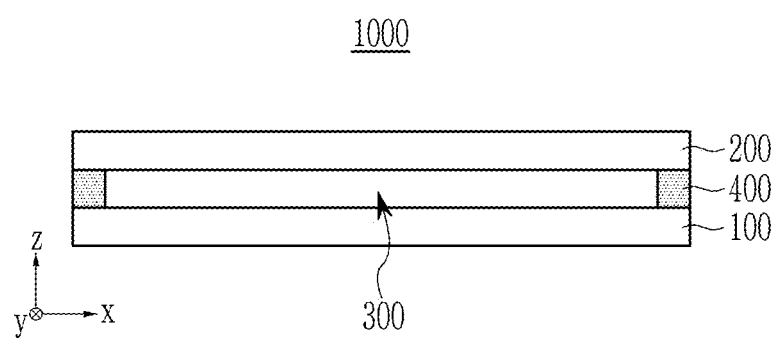
FIG. 2 is a cross-sectional view of the display panel of FIG. 1.

FIG. 1 is a perspective view of an embodiment of a display panel constructed according to the principles of the invention. FIG. 2 is a cross-sectional view of the display panel of FIG. 1.

Referring to FIGS. 1 and 2, the display panel 1000 according to an embodiment includes a light emitting panel 100, a color conversion panel 200, a light transmitting layer 300 disposed between the light emitting panel 100 and the color conversion panel 200, and a binding material 400 binding the light emitting panel 100 and the color conversion panel 200.

The light emitting panel 100 and the color conversion panel 200 face each other leaving the light transmitting layer 300 therebetween, and the color conversion panel 200 is disposed in a direction where light emits from the light emitting panel 100. The binding material 400 is disposed along edges of the light emitting panel 100 and the color conversion panel 200, and may be, for example, a sealing material.

Figure 3:
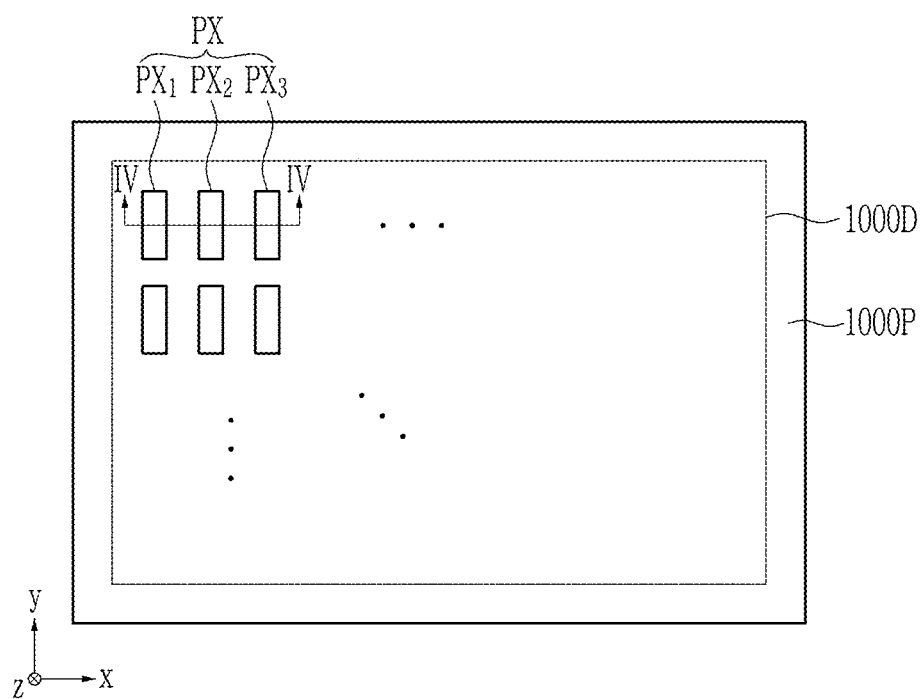
FIG. 3 is a plan view of an embodiment of a pixel arrangement of the display panel of FIG. 1.

FIG. 3 is a plan view of an embodiment of a pixel arrangement of the display panel of FIG. 1.

Referring to FIG. 3, the display panel 1000 includes a display area 1000D displaying an image and a non-display area 1000P positioned in a peripheral area of the display area 1000D and disposed with a binding material 400.

The display area 1000D includes a plurality of pixels PX arranged along with a row (e.g., x direction) and/or column (e.g., y direction), and each representative pixel PX includes a plurality of sub-pixels $PX_1$, $PX_2$, and $PX_3$ expressing different colors from each other. Herein, the embodiment is exemplified with a structure that three sub-pixels $PX_1$, $PX_2$, and $PX_3$ are configured to provide a pixel, but the embodiments are not limited thereto, and may further include an additional sub-pixel such as a white sub-pixel and may further include at least one sub-pixel expressing the same color. The plurality of pixels PX may be aligned, for example, in a Bayer matrix, a matrix sold under the trade designation PenTile by Samsung Display Co., Ltd., Gyeonggi-do, Republic of Korea, and/or a diamond matrix, and the like, but embodiments are not limited thereto.

Each of sub-pixels $PX_1$, $PX_2$, and $PX_3$ may express three primary colors or a color of a combination of three primary colors, for example, may express a color of red, green, blue, or a combination thereof. For example, the first sub-pixel $PX_1$ may express red, and the second sub-pixel $PX_2$ may express green, and the third sub-pixel $PX_3$ may express blue.

In the drawing, all sub-pixels are exemplified to have the same size, but embodiments are not limited thereto, and at least one of the sub-pixels may be larger or smaller than other sub-pixels. In the drawing, all sub-pixels are exemplified to have the same shape, but embodiments are not limited thereto, and at least one of the sub-pixels may have different shape from other sub-pixels.

Figure 4:
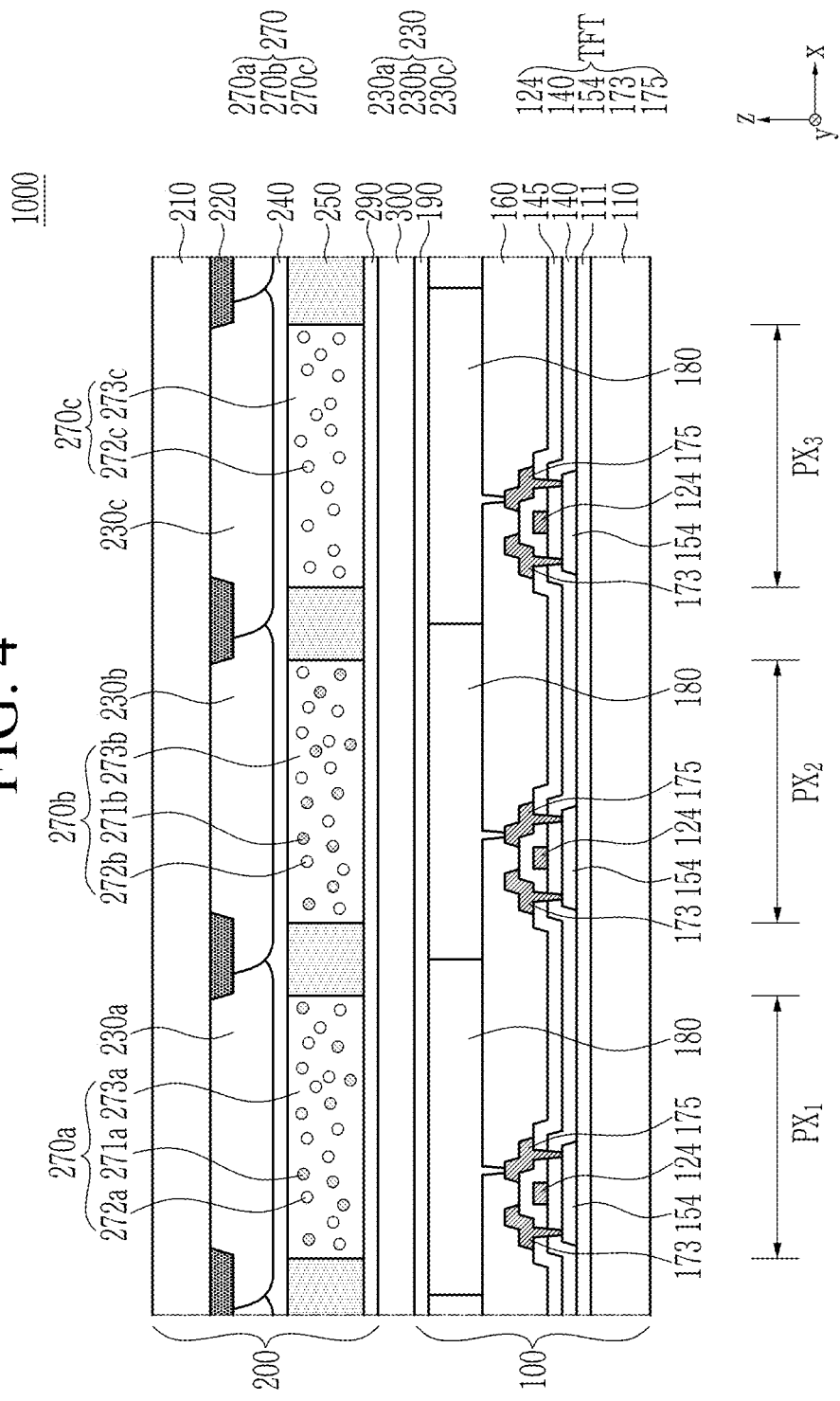
FIG. 4 is a cross-sectional view taken along line IV-IV of the display panel of FIG. 3.

FIG. 4 is a cross-sectional view taken along line IV-IV of the display panel of FIG. 3.

Referring to FIG. 4, the light emitting panel 100 and the color conversion panel 200 will be sequentially described. The light emitting panel 100 may include a light emitting element that emits light in a predetermined wavelength region and a circuit element for switching and/or driving the light emitting element and specifically, may include the lower substrate 110, the buffer layer 111, and the thin film transistor (TFT), a light emitting element 180, and an encapsulation layer 190.

The lower substrate 110 may be a glass substrate or a polymer substrate, and the polymer substrate may include, for example, a polyimide, a polyamide, a polyamideimide, a polyethylene terephthalate, a polyethylene naphthalene, a polymethyl methacrylate, a polycarbonate, a copolymer thereof, or a combination thereof, but embodiments are not limited thereto.

The buffer layer 111 may include an organic material, an inorganic material, or an organic-inorganic material, and may include, for example, an oxide, a nitride, or an oxynitride, for example, a silicon oxide, a silicon nitride, a silicon oxynitride, or a combination thereof, but embodiments are not limited thereto. The buffer layer 111 may be one layer or two or more layers, and may cover the whole surface of the lower substrate 110. The buffer layer 111 may be omitted.

The thin film transistor (TFT) may be a three-terminal element for switching and/or driving the light emitting element 180, which will be described below, and one or two or more may be included for each sub-pixel. The thin film transistor (TFT) includes a gate electrode 124, a semiconductor layer 154 overlapped with the gate electrode 124, a gate insulating film 140 between the gate electrode 124 and the semiconductor layer 154, and a source electrode 173 and a drain electrode 175 electrically connected to the a semiconductor layer 154. In the drawings, a coplanar top gate structure is shown as an example, but the embodiments are not limited to this structure and may have various structures.

The gate electrode 124 is electrically connected to a gate line, and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as an amorphous silicon, a polycrystalline silicon, or an oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor my include, for example, an indium-gallium-zinc oxide, a zinc-tin oxide, or a combination thereof, but is not limited thereto. The semiconductor layer 154 may include a channel region and doped regions that are disposed on both sides of the channel region and are electrically connected to the source electrode 173 and the drain electrode 175, respectively.

The gate insulating film 140 may include an organic material, an inorganic material, or an organic-inorganic material, and may include, for example, an oxide, a nitride, or an oxynitride, and, for example, a silicon oxide, a silicon nitride, a silicon oxynitride, or a combination thereof, but is not limited thereto. As illustrated, an example in which the gate insulating film 140 is formed on the whole surface of the lower substrate 110 is illustrated, but the embodiments are not limited thereto, and may be selectively formed between the gate electrode 124 and the semiconductor 154. The gate insulating film 140 may be one or two or more layers.

The source electrode 173 and the drain electrode 175 may include a low-resistance metal such as aluminum (Al), molybdenum (Mo), copper (Cu), titanium (Ti), silver (Ag), gold (Au), an alloy thereof, or a combination thereof, but is not limited thereto. Each of the source electrode 173 and the drain electrode 175 may be electrically connected to a doped region of the semiconductor layer 154. The source electrode 173 is electrically connected to a data line, and the drain electrode 175 is electrically connected to a light emitter, which may be in the form of a light emitting element 180 to be described below.

An interlayer insulating film 145 is additionally formed between the gate electrode 124 and the source/drain electrodes 173 and 175. The interlayer insulating film 145 may include an organic material, an inorganic material, or an organic-inorganic material, and may include, for example, an oxide, a nitride, or an oxynitride, for example, a silicon oxide, a silicon nitride, a silicon oxynitride, or a combination thereof, but is not limited thereto. The interlayer insulating film 145 may be one layer or two or more layers.

A protective film 160 is formed on the thin film transistor (TFT). The protective film 160 may be, for example, a passivation film. The protective film 160 may include an organic material, an inorganic material, or an organic-inorganic material, and may include, for example, a polyacrylic compound, a polyimide, a polyamide, a polyamide-imide, or a combination thereof, but is not limited thereto. The protective film 160 may be one layer or two or more layers.

The light emitting element 180 may be dispersed in each sub-pixel $PX_1$, $PX_2$, $PX_3$, and the light emitting element 180 disposed in each sub-pixel $PX_1$, $PX_2$, $PX_3$ may be independently operated. The light emitting element 180 may be, for example, a light emitting diode, and may include a pair of electrodes and a light emitting layer positioned between the pair of electrodes. The light emitting layer may include a light emitting body capable of emitting light in a predetermined wavelength region, for example, may include a light emitting body emitting light at a first emission spectrum pertained to a visible wavelength spectrum. The light emitting body may include an organic light emitting body, an inorganic light emitting body, an organic/inorganic light emitting body, or a combination thereof, and may be one type or at least two types thereof.

The light emitting element 180 may be, for example, an organic light emitting diode, an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

Figure 5:
FIG. 5 is a cross-sectional view of an embodiment of a light emitting element constructed according to the principles of the invention.

FIG. 5 is a cross-sectional view of an embodiment of a light emitting element constructed according to the principles of the invention.

Referring to FIG. 5, the light emitting element 180 includes a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may be disposed to face each other along a thickness direction (e.g., z direction), and any one of the first electrode 181 and the second electrode 182 may be an anode and the other may be a cathode. The first electrode 181 may be a transmissive electrode, a semi-transmissive electrode, or a reflective electrode, and the second electrode 182 may be a transmissive electrode or a semi-transmissive electrode. The transmissive or semi-transmissive electrodes may be made of, for example, a conductive oxide such as an indium tin oxide (ITO), an indium zinc oxide (IZO), a zinc oxide (ZnO), a tin oxide (SnO), an aluminum tin oxide (AlTO), and a fluorine-doped tin oxide (FTO) or a metal thin film of a thin single layer or multiple layers including silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitting body capable of emitting third light. An emission spectrum of the third light may belong to a relatively short wavelength region of the visible light wavelength spectrum, and may be, for example, a blue emission spectrum. The maximum luminescent peak wavelength of the third light may belong to a wavelength range of greater than or equal to about 400 nm and less than about 500 nm, and within the above range a wavelength range of about 410 nm to about 490 nm or about 420 nm to about 480 nm. The light emitting body may be one or two or more types.

For example, the light emitting layer 183 may include a host material and a dopant material. For example, the light emitting layer 183 may include a phosphorescent material, a fluorescent material, or a combination thereof. For example, the light emitting body may include an organic light emitting body, and the organic light emitting body may be a low molecular weight compound, a polymer, or a combination thereof. When the light emitting body includes an organic light emitting body, the light emitting element 180 may be an organic light emitting diode.

For example, the light emitting body may include an inorganic light emitting body, and the inorganic light emitting body may be an inorganic semiconductor, a quantum dot, a perovskite, or a combination thereof. When the light emitting body includes an inorganic light emitting body, the light emitting element 180 may be a quantum dot light emitting diode, a perovskite light emitting diode, or a micro light emitting diode.

The auxiliary layers 184 and 185 may be disposed between the first electrode 181 and the light emitting layer 183 and between the second electrode 182 and the light emitting layer 183, respectively, and may be charge auxiliary layers controlling injection and/or mobility of charges, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. At least one of the auxiliary layers 184 and 185 may be omitted.

Light emitting elements 180 disposed in each sub-pixel $PX_1$, $PX_2$, and $PX_3$ may be same as or different from each other. The light emitting elements 180 disposed in each sub-pixel $PX_1$, $PX_2$, and $PX_3$ may emit light at the same emission spectrum as each other, for example, may each emit light at a blue emission spectrum, for example, may emit light at a blue emission spectrum having a maximum emission wavelength in a wavelength region of greater than or equal to about 400 nm and less than about 500 nm, about 410 nm to about 490 nm, or about 420 nm to about 480 nm. Light emitting elements 180 disposed in each sub-pixel $PX_1$, $PX_2$, $PX_3$ may be separated by a pixel defining layer.

Referring back to FIGS. 1 to 4, the encapsulation layer 190 covers the light emitting element 180 and may include a glass plate, a metal thin film, an organic film, an inorganic film, an organic-inorganic film, or a combination thereof. The organic film may include, for example, an acrylic resin, a (meth)acrylic resin, a polyisoprene, a vinyl resin, an epoxy resin, an urethane resin, a cellulose resin, a perylene resin, or a combination thereof, but is not limited thereto. The inorganic film may include, for example an oxide, a nitride, and/or an oxynitride, such as a silicon oxide, a silicon nitride, a silicon oxynitride, an aluminum oxide, an aluminum nitride, an aluminum oxynitride, a zirconium oxide, a zirconium nitride, a zirconium oxynitride, a titanium oxide, a titanium nitride, a titanium oxynitride, a hafnium oxide, a hafnium nitride, a hafnium oxynitride, a tantalum oxide, a tantalum nitride, a tantalum oxynitride, a lithium fluoride, or a combination thereof, but is not limited thereto. The organic-inorganic film may include, for example, a polyorganosiloxane, but is not limited thereto. The encapsulation layer 190 may be one layer or two or more layers.

The color conversion panel 200 may convert light at a third emission spectrum (e.g., blue light) supplied from the light emitting panel 100 to light at a first or second emission spectrum (e.g., red light or green light) different from the third emission spectrum and emit light to the observer side, and specifically, may include a upper substrate 210, a light blocking pattern 220, a color filter layer 230, a planarization layer 240, a partition wall 250, a color conversion layer 270, and an encapsulation layer 290.

The upper substrate 210 may be a glass substrate or a polymer substrate, and the polymer substrate may include, for example, a polyimide, a polyamide, a polyamideimide, a polyethylene terephthalate, a polyethylene naphthalene, a polymethyl methacrylate, a polycarbonate, a copolymer thereof, or a combination thereof, but is not limited thereto.

The color conversion layer 270 faces the light emitting element 180 of the light emitting panel 100. The color conversion layer 270 may include at least one color conversion region for converting an emission spectrum of light supplied from the light emitting panel 100 into another emission spectrum and the color conversion region may convert, for example, light of an emission spectrum supplied from the light emitting panel 100 into light of an emission spectrum of a color displayed by each of the sub-pixels $PX_1$, $PX_2$, and $PX_3$.

The color conversion region may convert and emit light at a wavelength spectrum of color expressed in each sub-pixel $PX_1$, $PX_2$, and $PX_3$, so quantum dots included in each color conversion region may be different from each other.

As shown in FIG. 4, at least part of the color conversion layer 270 may include quantum dots, for example, the color conversion layer 270 may include a color conversion region, in turn, including a first color conversion region 270a included in the first sub-pixel $PX_1$ and including the first quantum dot 271a, a second color conversion region 270b included in the second sub-pixel $PX_2$ and including the second quantum dot 271b, and a light transmitting region 270c.

The first quantum dot 271a included in the first color conversion region 270a may convert light at the third emission spectrum emitted from the light emitting panel 100 to light at the first emission spectrum same as the wavelength spectrum of the color expressed in the first sub-pixel $PX_1$. The first emission spectrum may be different from the third emission spectrum and may be longer wavelength spectrum than the third emission spectrum.

The second quantum dot 271b included in the second color conversion region 270b may convert light at the third emission spectrum emitted from the light emitting panel 100 to light at the second emission spectrum same as the wavelength spectrum of the color expressed in the second sub-pixel $PX_2$. The second emission spectrum may be different from each of the third and first emission spectrums and may be a longer wavelength spectrum than the third emission spectrum.

For example, when the light emitting element 180 of the light emitting panel 100 emits light at a blue emission spectrum, and when first sub-pixel $PX_1$, second sub-pixel $PX_2$ and third sub-pixel $PX_3$ express red, green, and blue, respectively, the first quantum dot 271a included in the first color conversion region 270a may convert light at a blue emission spectrum to light at a red emission spectrum, and the second quantum dot 271b included in the second color conversion region 270b may convert light at a blue emission spectrum to light at a green emission spectrum. In this case, as the first quantum dot 271a emits light at the longer wavelength spectrum than the second quantum dot 271b, the size of the first quantum dot 271a may be larger than the size of the second quantum dot 271b. Blue expressed in the third sub-pixel $PX_3$ may be expressed by light at a blue emission spectrum emitted from the light emitting element 180 of the light emitting panel 100, so may be expressed through a light transmitting region 270c without an addition color converting body (quantum dot). But, the third sub-pixel $PX_3$ may further include a color converting body such as quantum dot emitting light at a blue emission spectrum.

The first color conversion region 270a, the second color conversion region 270b, and the light transmitting region 270c may further include scattering particles 272a, 272b, and 272c, respectively. The scattering particles 272a, 272b, and 272c scatter and/or reflect light emitted from quantum dots 271a, 271b, and/or the light emitting element 180 of the light emitting panel 100 and introduce the same to the color filter layer 230. The scattering particles 272a, 272b, and 272c may be nanoparticles having a low refractive index, for example, may be a silicon oxide, a titanium oxide, or a combination thereof, but are not limited thereto.

The first color conversion region 270a, the second color conversion region 270b, and the light transmitting region 270c may each further include light transmitting resins 273a, 273b, and 273c. The light transmitting resin 273a, 273b, and 273c may be a dispersive medium dispersing quantum dots 271a, 271b and/or scattering particles 272a, 272b, and 272c, for example, may be an acrylic resin, an urethane resin, a silicone resin, an epoxy resin, a cardo-based resin, an imide resin, a derivative thereof, or a combination thereof, but is not limited thereto.

The partition wall 250 may define each region of the color conversion layer 270 and may be positioned between adjacent regions. For example, the partition wall 250 may define each of the aforementioned first color conversion region 270a, the second color conversion region 270b, and the light transmitting region 270c and may be positioned in each of between the adjacent first color conversion region 270a and second color conversion region 270b, between the adjacent second color conversion region 270b and light transmitting region 270c, and between the adjacent first color conversion region 270a and light transmitting region 270c. The partition wall 250 may provide space where a composition for the color conversion layer 270 is to be supplied and simultaneously may prevent overflowing each composition for the color conversion region 270a, the second color conversion region 270b, and the light transmitting region 270c into the adjacent the first color conversion region 270a, the second color conversion region 270b, and the light transmitting region 270c during providing the first color conversion region 270a, the second color conversion region 270b, and the light transmitting region 270c.

The partition wall 250 may be directly contacted with the first color conversion region 270a, the second color conversion region 270b, and the light transmitting region 270c, and an additional layer may be not interposed between the partition wall 250 and the first color conversion region 270a, between the partition wall 250 and the second color conversion region 270b, and between the partition wall 250 and the light transmitting region 270c. A generally column-shaped partition wall 250 having the same width is exemplified in the drawing, but embodiments are not limited thereto, and the partition wall 250 may have a variety of sizes and shapes. For example, the partition wall 250 may have a generally trapezoidal cross-sectional shape.

The color filter layer 230 is disposed in a direction where light passed through the color conversion layer 270 is emitted. The color filter layer 230 may include color filters 230a, 230b, and 230c selectively transmitting light at different wavelength spectrums disposed in each sub-pixel $PX_1$, $PX_2$, and $PX_3$. The color filters 230a, 230b, and 230c may selectively transmit light at the same wavelength spectrum as the color expressed in each sub-pixel $PX_1$, $PX_2$, and $PX_3$ and selectively transmit light at the emission spectrum converted in each region of the color conversion layer 270.

For example, when the first sub-pixel $PX_1$, the second sub-pixel $PX_2$, and the third sub-pixel $PX_3$ express red, green, and blue, respectively, and when the first color conversion region 270a, the second color conversion region 270b, and the light transmitting region 270c emit each light of the red emission spectrum, the green emission spectrum, and the blue emission spectrum, respectively, the first color filter 230a overlapped with the first color conversion region 270a may be a red filter, the second color filter 230b overlapped with the second color conversion region 270b may be a green filter, and the third color filter 230c overlapped with the light transmitting region 270c may be a blue filter. The first color filter 230a, the second color filter 230b, or the third color filter 230c may include pigments or dyes which selectively transmit light in a red wavelength spectrum, a green wavelength spectrum, or a blue wavelength spectrum, respectively, and absorb and/or reflect light at the other wavelength spectrum.

The color filter layer 230 may enhance a color purity of light emitted toward the upper substrate 210 by more concretely filtering light emitted from the color conversion layer 270. For example, the first color filter 230a overlapped with the first color conversion region 270a may enhance a color purity at, for example, light of red emission spectrum by blocking light which is not converted by the first quantum dot 271a of the first color conversion region 270a but passed through as is. For example, the second color filter 230b overlapped with the second color conversion region 270b may enhance a color purity of light at, for example, green emission spectrum by blocking light which is not converted by second quantum dots 271b of the second color conversion region 270b but passed through as is. For example, the third color filter 230c positioned overlapped with the light transmitting region 270c may enhance a color purity of light at a blue emission spectrum by blocking light except light of, for example, the blue emission spectrum. For example, at least a part of the first, second, and third color filters 230a, 230b, and 230c may be omitted, and for example, the third color filter 230c positioned overlapping the light transmitting region 270c may be omitted.

The light blocking pattern 220 may partition each sub-pixel $PX_1$, $PX_2$, and $PX_3$ and may be positioned between adjacent sub-pixels $PX_1$, $PX_2$, and $PX_3$. The light blocking pattern 220 may be, for example, a black matrix. The light blocking pattern 220 may be overlapped with the edge of the adjacent color filter 230a, 230b, and 230c.

The planarization layer 240 may be disposed between the color filter layer 230 and the color conversion layer 270, and may reduce or eliminate a step difference caused by the color filter layer 230. The planarization layer 240 may include an organic material, an inorganic material, an organic-inorganic material, or a combination thereof, for example an oxide, a nitride, or an oxynitride, for example a silicon oxide, a silicon nitride, a silicon oxynitride, or a combination thereof, but is not limited thereto. The planarization layer 240 may be one or two or more layers, and may cover an entire surface of the upper substrate 210.

The encapsulation layer 290 covers the color conversion layer 270 and the partition wall 250 and may include a glass plate, a metal thin film, an organic film, an inorganic film, an organic-inorganic film, or a combination thereof. The organic film may include, for example, an acrylic resin, a (meth)acrylic resin, a polyisoprene, a vinyl resin, an epoxy resin, an urethane resin, a cellulose resin, a perylene resin, or a combination thereof, but is not limited thereto. The inorganic film may include, for example an oxide, a nitride, and/or an oxynitride, such as a silicon oxide, a silicon nitride, a silicon oxynitride, an aluminum oxide, an aluminum nitride, an aluminum oxynitride, a zirconium oxide, a zirconium nitride, a zirconium oxynitride, a titanium oxide, a titanium nitride, a titanium oxynitride, a hafnium oxide, a hafnium nitride, a hafnium oxynitride, a tantalum oxide, a tantalum nitride, a tantalum oxynitride, a lithium fluoride, or a combination thereof, but is not limited thereto. The organic-inorganic film may include, for example, a polyorganosiloxane, but is not limited thereto. The encapsulation layer 290 may be one layer or two or more layers.

The light transmitting layer 300 may be disposed between the light emitting panel 100 and the color conversion panel 200. The light transmitting layer 300 may be, for example, a filler, and may include, for example, an organic material, an inorganic material, an organic-inorganic material, or a combination thereof, for example, an epoxy resin, a silicone compound, a polyorganosiloxane, or a combination thereof, but is not limited thereto.

The aforementioned display panel 1000 may be applied to various electronic devices including a display device, for example, a display device such as a television, a monitor, a computer, a tablet PC, or a mobile, or a lighting device such as a light source. In an embodiment, the electronic device (or display device) includes the color conversion panel or the display panel described herein.

EXAMPLES

Analysis Methods
[1] Measurement of External Quantum Efficiency (EQE) of Quantum Dot Composite External quantum efficiency is measured using a commercially available (e.g., equipped with integrating sphere) quantum efficiency measurement equipment (e.g., a measurement device sold under the trade designation QY manufactured by Hamamatsu Photonics Inc. of Hamamatsu-city, Japan) according to the following equation. Excitation light on measuring the quantum efficiency may be arbitrarily selected within 400 nm to 680 nm (e.g., 450 nm) considering optical properties of the provided quantum dots, and the like.

External quantum efficiency=$[A/B] \times 100(\%)$

A: number of photons emitted from the composite
B: number of photons of excitation light (supplied to the composite)

Viscosity of Composition

The viscosity of the composition is measured using a viscometer or a rheometer at a room temperature (e.g., 25° C.).

Measurement of Film Residual Ratio

At a room temperature and in an air environment, a film residual ratio is measured by the following equation.

[(Volume of ink film)/(Volume of ink filled in pixel unit)]×100

Reference Example 1

Quantum dots were prepared according to the known methods. Indium acetate and tris(trimethylsilyl)phosphine were reacted in 1-octadecene under a presence of palmitic acid to synthesize a indium phosphorus (InP) core. The obtained core was dispersed in toluene. Zinc acetate, oleic acid, and trioctylamine were vacuumed at an increased temperature of about 120° C. in to provide a zinc precursor, and a toluene dispersion of the InP core and a predetermined amount of elemental sulfer (S) precursor were added into the reaction flask and reacted at 280° C., and the reaction solution was promptly cooled at a room temperature to provide a reactant including InP/zinc sulfer (ZnS) core-shell quantum dots.

An excessive amount of ethanol was added into the reactant and centrifuged. The supernatant was discarded after centrifugation, and the precipitate was dried to provide quantum dots (hereinafter, referred to as first quantum dots) including oleic acid as an organic ligand on the surface thereof. It was confirmed that the first quantum dots emit red light.

Reference Example 2

The first quantum dots prepared in Reference Example 1 was subjected to a ligand exchange reaction under the known conditions to provide a second quantum dot including a second ligand represented by the following chemical formula:

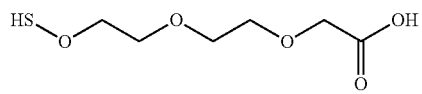 [SMILES: O=C(O)COCCOCCOS]

Comparative Example 1

(1) Preparation of Ink Composition:

A second solution including a liquid monomer including hexamethylene diacrylate, tetraethylene glycol diacrylate, dipropylene glycol diacrylate, tripropylene glycol diacrylate, or tripropylene glycol diacrylate, and a second quantum dot and titanium oxide fine particles (average particle diameter: about 200 nm) dispersed in the liquid monomer was prepared. A total solid content of the second solution was 100%.

In the second solution, the content of quantum dots was 43 wt % and the content of titanium oxide was 10 wt % based on the total solid contents.

Figure 6A:
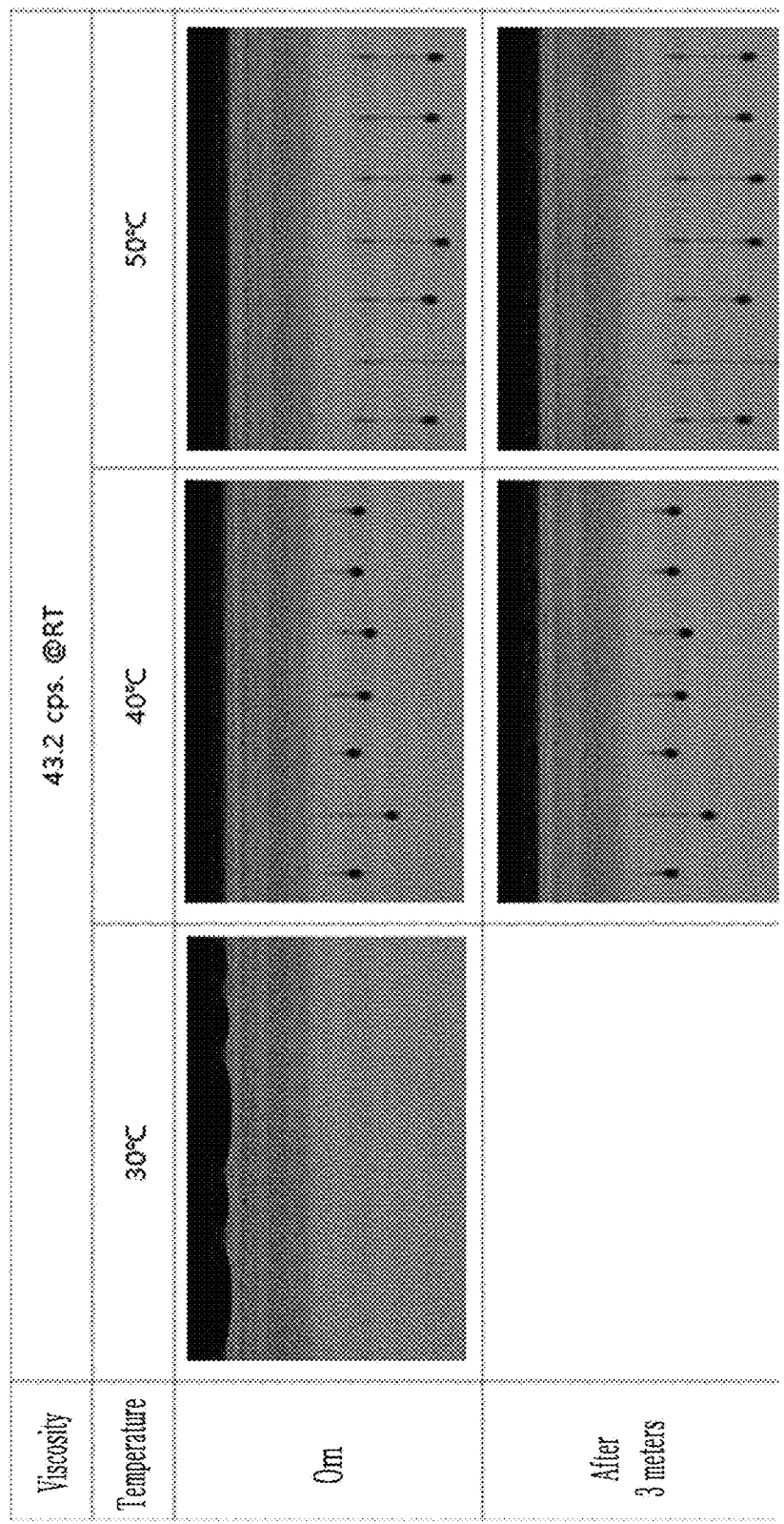
FIG. 6A depicts an ink jet ejection photograph of the ink composition of Comparative Example 1.
Figure 6B:
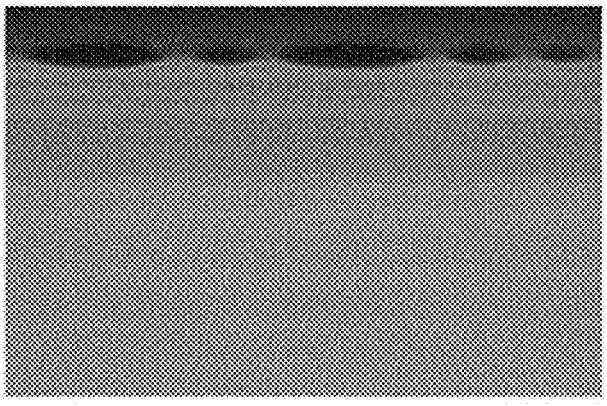
FIG. 6B shows an ink jet ejection photograph of the ink composition of Example 1 made according to the principles of the invention.

FIG. 6A depicts an ink jet ejection photograph of the ink composition of Comparative Example 1. FIG. 6B shows an ink jet ejection photograph of the ink composition of Example 1 made according to the principles of the invention.

(2) The prepared ink composition was ejected by an ink jet apparatus at a predetermined temperature, and a photograph thereof is shown in FIG. 6A. It is confirmed that the jetting characteristics were not good even in the heated state. A film was obtained from the obtained ink composition by an ink jet method and allowed to stand under the air atmosphere at a room temperature for 30 minutes to measure a film residual ratio, and the results were shown in FIG. 7.

Figure 8:
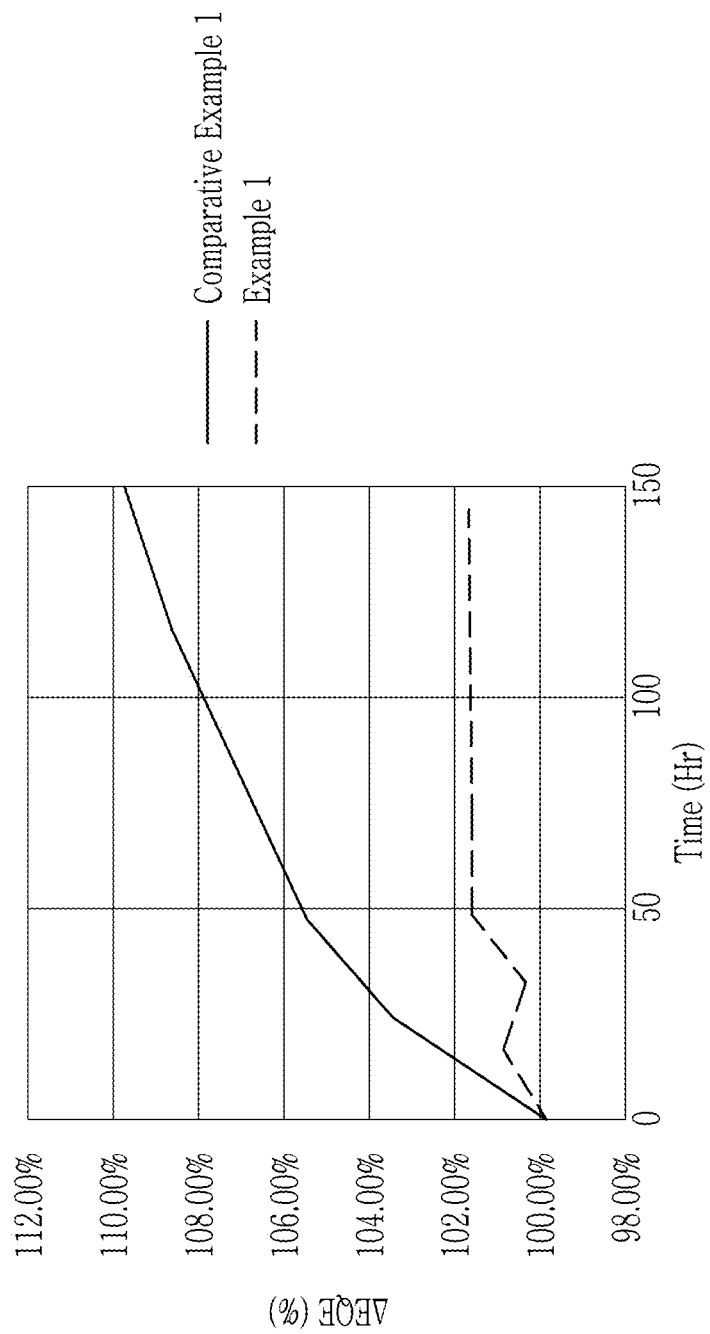
FIG. 8 is a graphical depiction showing changes in external quantum efficiency over time of a quantum dot composite prepared from the ink composition of Comparative Example 1 and a quantum dot composite prepared from the ink composition of Example 1.

(3) The prepared ink composition was ejected by an ink jet apparatus and exposed and the cured to provide a solid quantum dot (polymer) composite. The obtained quantum dot composite was measured for an quantum efficiency at 60° C. using 450 nm light, and FIG. 8 is a graph showing changes of external quantum efficiency over time. From the results of FIG. 8, it was confirmed that the obtained composite shows significantly and unexpectedly overshoot under the device driving condition.

Example 1

(1) Preparation of Ink Composition:

A first solution including a first quantum dot dispersed in an organic solvent (cyclohexylacetate (CHA, vapor pressure of 1.295 mmHg at 25° C.) or propylene glycol monomethyl ether acetate (PGMEA, vapor pressure of 3.7 mm Hg at 20° C.)) was obtained.

An ink composition (hereinafter, second solution) in accordance with the same procedure as in Comparative Example 1 was obtained.

The first solution and the second solution were mixed at a weight ratio of 20:80 to prepare an ink composition. It was confirmed that the obtained composition maintains a good (colloidal) dispersed phase without generating precipitation.

The prepared ink composition has a viscosity of 17.9 cPs, a vapor pressure of less than or equal to $10^{-3}$ mmHg at 20° C., and a surface tension of less than or equal to 35 mmHg at 23° C. The prepared ink composition has acid value and amine value of each 30 to 50 mg KOH/g.

(2) The prepared ink composition was ejected by an ink jet apparatus, and a photograph thereof is shown in FIG. 6B.

Figure 7:
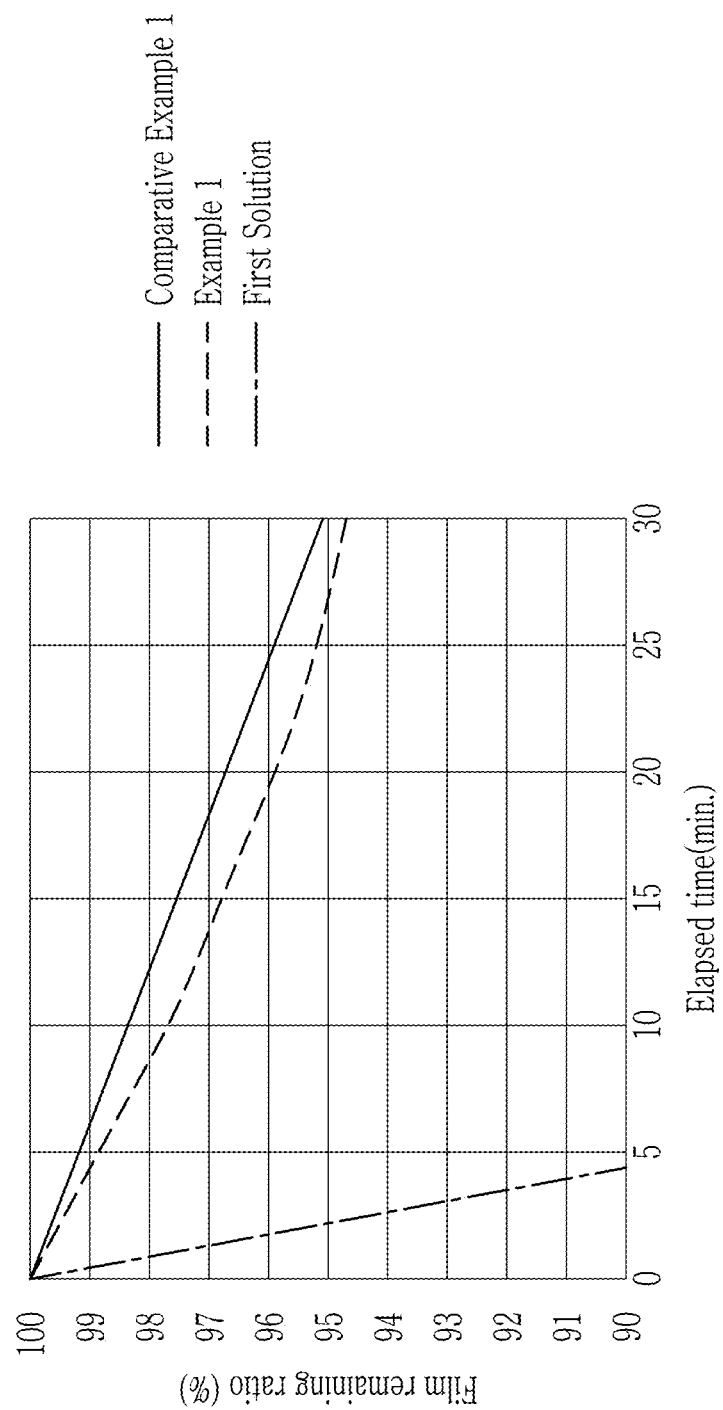
FIG. 7 is a graphical depiction showing changes in film residual ratio over time of films prepared from the quantum dot solution (first solution) of Reference Example 1, the ink composition of Comparative Example 1, and the ink composition of Example 1 made according to the principles of the invention.

FIG. 7 is a graphical depiction showing changes in a film residual ratio over time of films prepared from the quantum dot solution (first solution) of Reference Example 1, the ink composition of Comparative Example 1, and the ink composition of Example 1 made according to the principles of the invention. FIG. 8 is a graphical depiction showing changes in external quantum efficiency over time of a quantum dot composite prepared from the ink composition of Comparative Example 1 and a quantum dot composite prepared from the ink composition of Example 1.

The first solution and the ink composition were ejected with an ink jet apparatus to obtain a film, and the obtained film was allowed to stand in an air atmosphere at room temperature for 30 minutes to measure the film residual ratio, and the results are shown in FIG. 7. The results of FIG. 7 show that the ink monomer according to Example 1 has a film residual ratio similar to the liquid monomer based (non-solvent) composition according to Comparative Example 1. On the other hand, FIG. 7 shows that the first solution exhibits significantly and unexpectedly reduced film residual ratio within a short period of time.

(3) The prepared ink composition was ejected to an ink jet apparatus and exposed to light and then cured to provide a solid quantum dot (polymer) composite. The obtained quantum dot composite was measured for an external quantum efficiency, and the changes of the external quantum efficiency over time relative to the initial efficiency (100%) are shown in a graph of FIG. 8. The results of FIG. 8 show that the quantum dot composite prepared from the ink composition according to Example 1 significantly and unexpectedly mitigate overshoot phenomenon under the device-operating condition.

Experimental Example 1

Compositions (Compositions 1 to 8) were prepared in accordance with the similar procedure to Example 1 while adjusting the dispersant so that the first solution and the second solution were configured to satisfy the conditions described in the following table. The dispersed phases of the prepared compositions were each visually monitored by unaided eyes, and the results are summarized in Table 1.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An ink composition, comprising:
a plurality of quantum dots, a liquid monomer, an initiator, and optionally an organic solvent, wherein
the plurality of quantum dots comprises:
a first quantum dot comprising a first ligand; and
a second quantum dot comprising a second ligand different from the first ligand,
the ink composition is configured to emit a first light, and
the first light is green light, red light, or blue light.

2. The ink composition of claim 1, wherein a maximum emission peak of the first light has a full width at half maximum of less than or equal to about 45 nm.

3. The ink composition of claim 1, wherein
the first ligand or the second ligand, independently from one another, comprises RCOOH, RNH$_2$, R$_2$NH, R$_3$N, RSH, R$_3$PO, R$_3$P, ROH, RCOOR', RPO(OH)$_2$, RHPOOH, R$_2$POOH, a polymer organic ligand, or a combination thereof, wherein R and the R' are, independently from one another, a substituted or unsubstituted C$_1$ to C$_{100}$ aliphatic hydrocarbon group, a substituted or unsubstituted C$_6$ to C$_{50}$ aromatic hydrocarbon group, or a combination thereof, and at least one methylene of the aliphatic hydrocarbon group is option-

TABLE 1

| | First solution | Second solution | Dispersed state |
|---|---|---|---|
| Composition 1 | Only acid value or amine values is present | Only acid value or amine values is present | No precipitation |
| Composition 2 | Amphoteric [note 1)] | Amphoteric | No precipitation |
| Composition 3 | Only acid value or amine values is present | Amphoteric, a difference between acid value and amine value is greater than or equal to about 5 mg KOH/g and the acid value and/or amine value is less than about 35 mg KOH/g | sedimentation |
| Composition 4 | Only acid value or amine values is present | Amphoteric but a difference between acid value and amine value is less than about 5 mg KOH/g | No precipitation |
| Composition 5 | | Amphoteric, but acid value is greater than or equal to about 35 mg KOH/g and amine value is greater than or equal to about 35 mg KOH/g | No precipitation |
| Composition 6 | Amphoteric, a difference between acid value and amine value is greater than or equal to about 5 mg KOH/g and the acid value and/or amine value is less than about 35 mg KOH/g | Only acid value or amine values is present | Precipitation |
| Composition 7 | Amphoteric but a difference between acid value and amine value is less than about 5 mg KOH/g | Only acid value or amine values is present | No precipitation |
| Composition 8 | Amphoteric, but acid value is greater than or equal to about 35 mg KOH/g and amine value is greater than or equal to about 35 mg KOH/g | Only acid value or amine values is present | No precipitation |

[note 1)] Amphoteric: in case of having both acid value and amine value ally replaced by a sulfonyl, a carbonyl, an ether, a sulfide, a sulfoxide, an ester, an amide of the formula —C(=O)NR"—, wherein R" is hydrogen or a $C_1$ to $C_{10}$ alkyl group), or a combination thereof.

4. The ink composition of claim 1, wherein the first ligand comprises a monocarboxylic acid compound having a $C_{10}$ to $C_{40}$ substituted or unsubstituted hydrocarbyl group.

5. The ink composition of claim 1, wherein the second ligand comprises an organic compound having a functional group of an amine group, a thiol group, a carboxylic acid group, a phosphine group, or a combination thereof and a moiety linked to the functional group and of the following formula:

*-L-A wherein L is a substituted or unsubstituted $C_1$ to $C_{30}$ alkylene group, a substituted or unsubstituted $C_2$ to $C_{30}$ alkenylene group, a substituted or unsubstituted $C_3$ to $C_{30}$ cycloalkylene group, a substituted or unsubstituted $C_3$ to $C_{30}$ heterocycloalkylene group, a substituted or unsubstituted $C_6$ to $C_{30}$ arylene group, or a substituted or unsubstituted $C_3$ to $C_{30}$ heteroarylene group, a sulfonyl, a carbonyl, an ether, a sulfide, a sulfoxide, an ester, an amide of the formula —C(=O)NR"—, or a combination thereof, A is hydrogen, —COOH, —NR"$_3$, wherein R" is, independently from each other, hydrogen or $C_1$ to $C_{10}$ alkyl group, or a combination thereof, and

* is a site linked to the functional group.

6. The ink composition of claim 1, wherein the liquid monomer comprises a compound having a carbon-carbon double bond and a vapor pressure of less than or equal to about $10^{-5}$ mmHg.

7. The ink composition of claim 1, wherein the organic solvent comprises a $C_3$ to $C_{40}$ substituted or unsubstituted aliphatic hydrocarbon solvent, a $C_6$ to $C_{40}$ substituted or unsubstituted aromatic hydrocarbon solvent, a $C_3$ to $C_{40}$ substituted or unsubstituted alicyclic hydrocarbon solvent, an alkylene glycol alkyl ether acetate solvent, an alkylacetamide solvent, or a combination thereof.

8. The ink composition of claim 1, wherein
the liquid monomer comprises a monoacrylate compound, a diacrylate compound, a triacrylate compound, a tetraacrylate compound, a pentaacrylate compound, or a hexaacrylate compound, or a combination thereof, or
the organic solvent comprises propylene glycolmonomethyletheracetate, dimethyl acetamide, cyclohexylacetate, or a combination thereof.

9. The ink composition of claim 1, wherein the ink composition has a viscosity of less than or equal to about 40 cPs and a vapor pressure of less than or equal to about $10^{-3}$ mmHg.

10. The ink composition of claim 1, wherein the ink composition has both an acid value and an amine value, and the acid value and the amine value are both greater than or equal to about 35 mg KOH/g, or the difference between the acid value and amine value is less than or equal to about 5 mg KOH/g.

11. The ink composition of claim 1, wherein the ink composition is configured to exhibit a film residual ratio of about 90% in 30 minutes after it is formed into a film.

12. The ink composition of claim 1, wherein in a solid state after polymerization thereof, the ink composition is configured to show a relative external quantum efficiency (EQE) with respect to an initial value thereof of about 100% that is less than or equal to about 104% during irradiation of about 100 hours with light having a wavelength of about 450 nm at a temperature of about 60° C.

13. A method of preparing the ink composition of claim 1 in which the ink composition of claim 1 comprises the organic solvent, the method comprising:
preparing a first solution comprising the first quantum dot and the organic solvent,
preparing a second solution comprising the second quantum dot and the liquid monomer; and
mixing the first solution and the second solution to maintain a colloidal dispersion state.

14. The method of claim 13, wherein the first solution and the second solution satisfy at least one of the following conditions:
at least one of the first solution and the second solution does not exhibit both an acid value and an amine value;
the first solution exhibits either an acid value or an amine value but not both an acid value and an amine value, and the second solution exhibits either an acid value or an amine value but not both an acid value and an amine value;
the first solution is amphoteric showing both an acid value and an amine value, and the second solution is also amphoteric showing both an acid value and an amine value; and
one of the first solution and the second solution is amphoteric showing both an acid value and an amine value and the other exhibits either an acid value or an amine value but not both an acid value and an amine value, in a solution having an amphotericity, a difference between the acid value and the amine value is less than about 5 mg KOH/g, or both the acid value and the amine value is greater than or equal to about 35 mg KOH/g.

15. An electronic device comprising:
a display device, the display device comprising:
a light emitter;
a color conversion apparatus comprising a quantum dot composition formed from the ink composition of claim 1; and
a partition wall defining each region of the layer.

16. The electronic device of claim 15, wherein a maximum emission peak of the first light has a full width at half maximum of less than or equal to about 45 nm.

* * * * *